(12) United States Patent
Tanaka

(10) Patent No.: US 11,335,480 B2
(45) Date of Patent: May 17, 2022

(54) RESISTOR

(71) Applicant: ROHM CO., LTD., Kyoto (JP)

(72) Inventor: Kosaku Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/255,203

(22) PCT Filed: Aug. 1, 2019

(86) PCT No.: PCT/JP2019/030226
§ 371 (c)(1),
(2) Date: Dec. 22, 2020

(87) PCT Pub. No.: WO2020/031844
PCT Pub. Date: Feb. 13, 2020

(65) Prior Publication Data
US 2021/0249162 A1    Aug. 12, 2021

(30) Foreign Application Priority Data
Aug. 10, 2018    (JP) .............................. JP2018-151383

(51) Int. Cl.
*H01C 1/148*    (2006.01)
*H01C 1/032*    (2006.01)
*H01C 7/18*    (2006.01)

(52) U.S. Cl.
CPC ............. *H01C 1/148* (2013.01); *H01C 1/032* (2013.01); *H01C 7/18* (2013.01)

(58) Field of Classification Search
CPC .......... H01C 1/148; H01C 1/032; H01C 7/17; H01C 17/232; H01C 17/242
See application file for complete search history.

(56) References Cited

U.S. PATENT DOCUMENTS

| | | | | |
|---|---|---|---|---|
| 4,434,416 A | * | 2/1984 | Schonberger ............ | H01C 7/04 338/22 R |
| 7,119,655 B2 | * | 10/2006 | Starling ............... | H01C 1/1406 338/22 R |
| 10,340,063 B2 | * | 7/2019 | Kinoshita ............. | H01C 1/142 |
| 10,804,013 B2 | * | 10/2020 | Tseng ..................... | H02H 9/026 |
| 2003/0227731 A1 | * | 12/2003 | Huang ................. | H01C 1/1406 361/103 |

(Continued)

FOREIGN PATENT DOCUMENTS

| | | |
|---|---|---|
| CN | 202996456 U | 6/2013 |
| JP | H07211509 A | 8/1995 |

(Continued)

*Primary Examiner* — Kyung S Lee
(74) *Attorney, Agent, or Firm* — Rabin & Berdo, P.C.

(57) ABSTRACT

A resistor includes a first insulator, a resistive body, a second insulator, a pair of electrodes, and a covering body. The first insulator has a first obverse surface facing in a thickness direction thereof. The resistive body is provided on the first obverse surface. The second insulator covers the resistive body. The pair of electrodes are electrically connected to the resistive body at both sides in a first direction perpendicular to the thickness direction. The covering body is formed on at least one of the first insulator and the second insulator. The covering body has electrical conductivity. The first layer is in contact with at least one of the first insulator and the second insulator.

18 Claims, 21 Drawing Sheets

(56) References Cited

U.S. PATENT DOCUMENTS

| | | | | |
|---|---|---|---|---|
| 2004/0108936 A1* | 6/2004 | Han | ................ | H01C 7/02 |
| | | | | 338/22 R |
| 2006/0114097 A1* | 6/2006 | Starling | ................ | H01C 7/027 |
| | | | | 338/32 R |
| 2013/0341301 A1* | 12/2013 | Chen | ................ | H01C 17/22 |
| | | | | 216/20 |

FOREIGN PATENT DOCUMENTS

| | | |
|---|---|---|
| JP | H10135015 A | 5/1998 |
| JP | H11168002 A | 6/1999 |
| JP | 2000277301 A | 10/2000 |
| JP | 2011029414 A | 2/2011 |
| JP | 2013225602 A | 10/2013 |
| JP | 2014007374 A | 1/2014 |
| JP | 2015019023 A | 1/2015 |
| WO | 2017110079 A1 | 6/2017 |
| WO | 2017188307 A1 | 11/2017 |

* cited by examiner

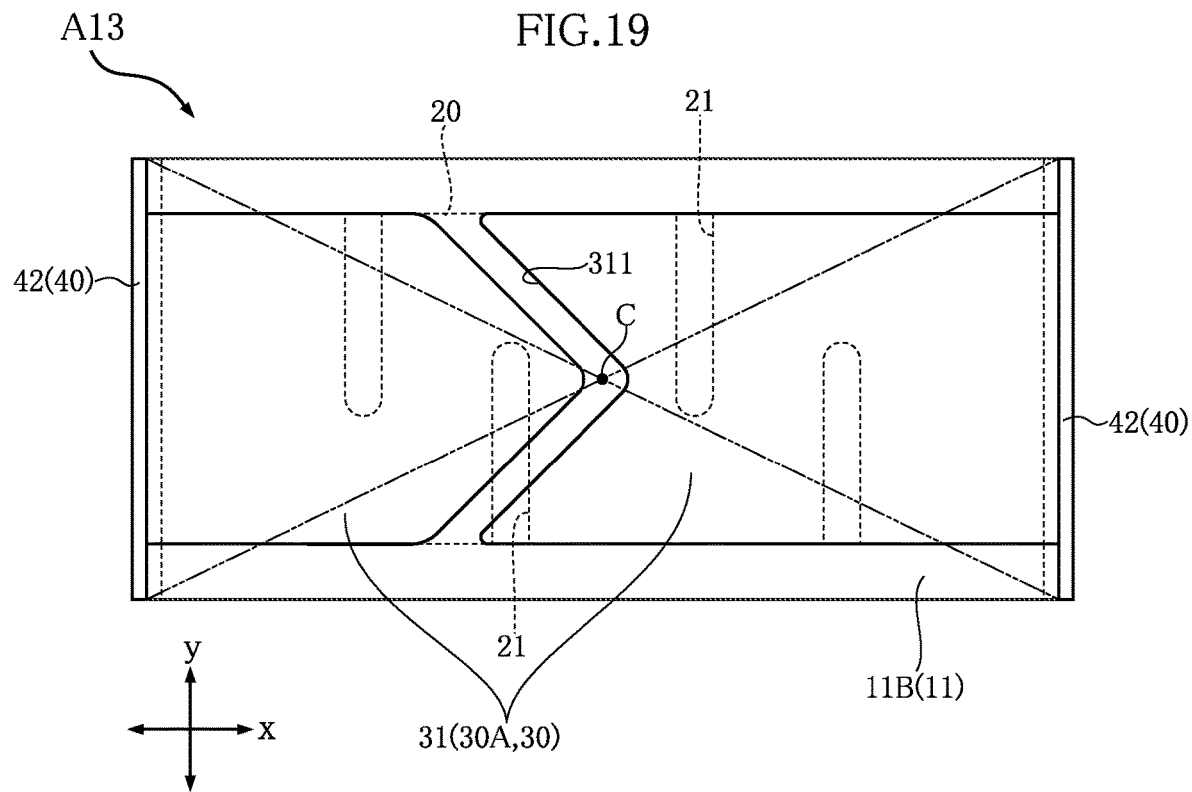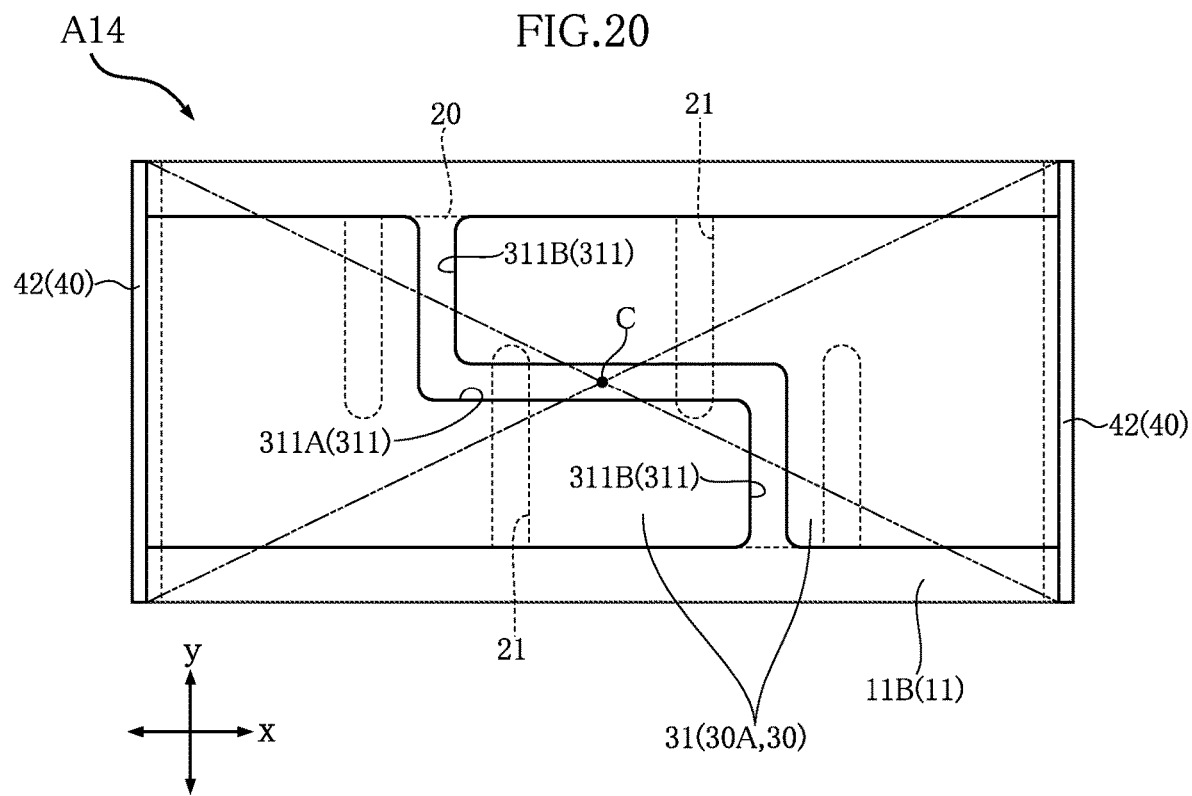

RESISTOR

TECHNICAL FIELD

The present disclosure relates to a resistor mainly used for current detection.

BACKGROUND ART

A resistor that includes a resistive body made of a metallic material is conventionally known. The resistor is mainly used for current detection. Patent Document 1 discloses an example of such a resistor including a resistive body. The resistor includes a resistive body, and a pair of electrodes connected to the respective ends of the resistor.

Detecting a larger current with the resistor increases heat generated by the resistor. When the temperature of the resistor rises due to the heat, the resistance value of the resistor may fluctuate. It is thus necessary to improve the heat dissipation property of the resistor.

PRIOR ART DOCUMENT

Patent Document

Patent Document 1: JP-A-2013-225602

SUMMARY OF THE INVENTION

Technical Problem

In view of the above circumstances, an object of the present disclosure is to provide a resistor capable of improving heat dissipation property.

Solution to Problem

A resistor provided by the present disclosure includes: a first insulator including an obverse surface facing in a thickness direction; a resistive body arranged on the obverse surface; a second insulator covering the resistive body; a pair of electrodes electrically connected to the resistive body at both sides in a first direction perpendicular to the thickness direction; and a covering body formed on at least one of the first insulator and the second insulator, wherein the covering body has a first layer, the first layer including electrical conductivity and being in contact with at least one of the first insulator and the second insulator.

Other features and advantages of the present disclosure will become apparent from the detailed description given below with reference to the accompanying drawings.

BRIEF DESCRIPTION OF THE DRAWINGS

FIG. 19 is a plan view of a resistor (seen though a second layer of a covering body) according to a third variation of the first embodiment of the present disclosure;

FIG. 20 is a plan view of a resistor (seen though a second layer of a covering body) according to a fourth variation of the first embodiment of the present disclosure;

MODES FOR CARRYING OUT THE INVENTION

The following describes embodiments of the present disclosure with reference to the attached drawings.

First Embodiment

Figure 1:
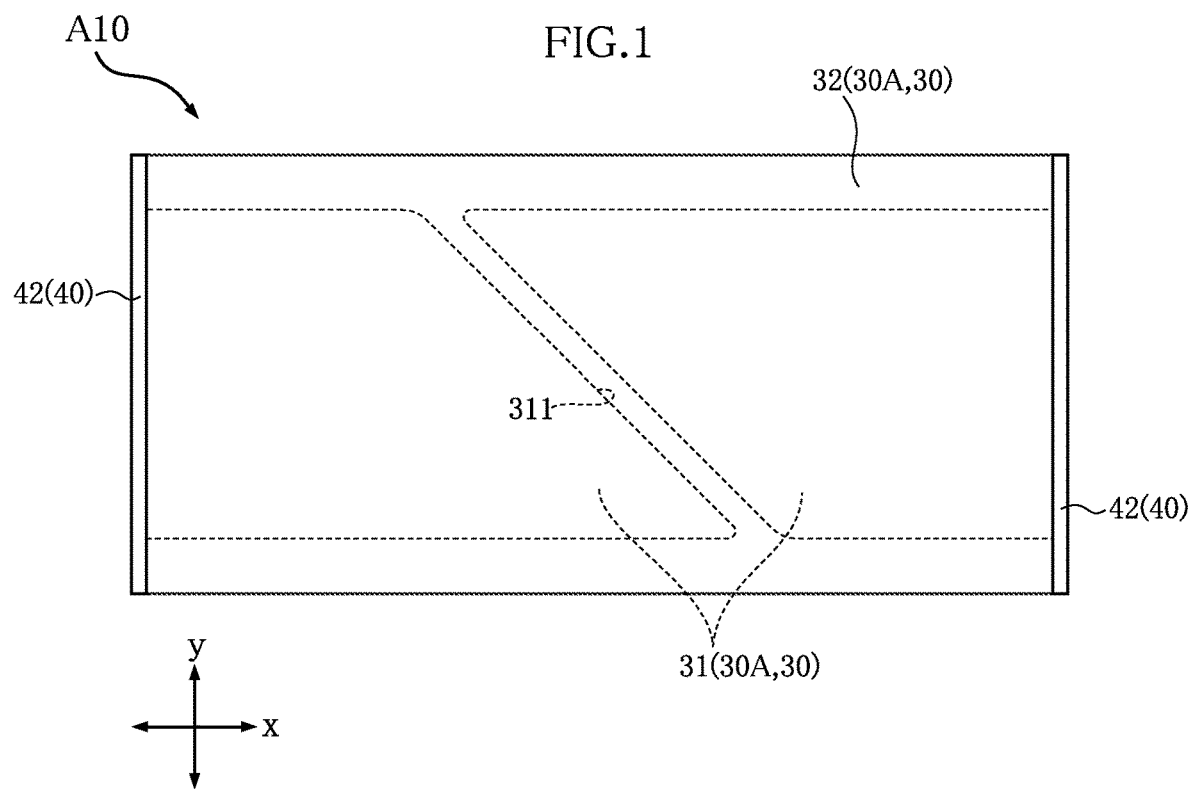
FIG. 1 is a plan view of a resistor according to a first embodiment of the present disclosure.
Figure 2:
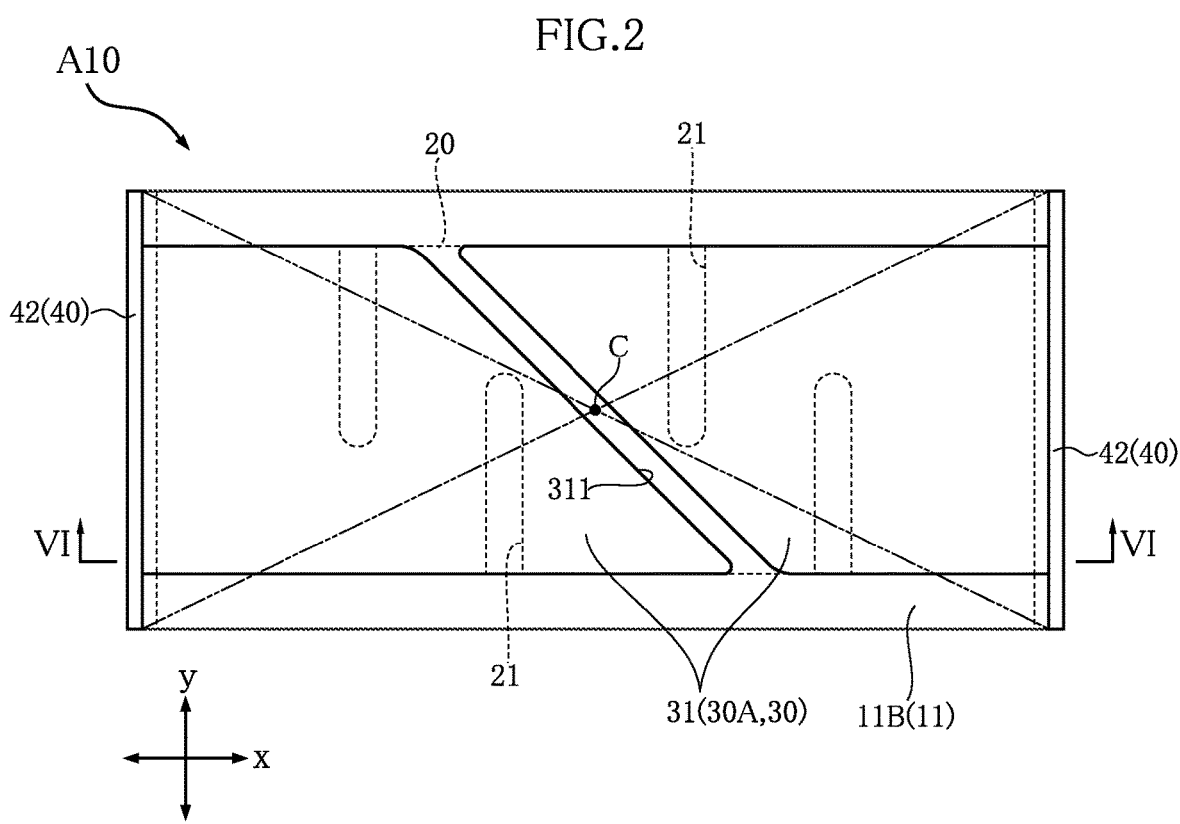
FIG. 2 is a plan view corresponding to FIG. 1 and seen through a second layer of a covering body.
Figure 3:
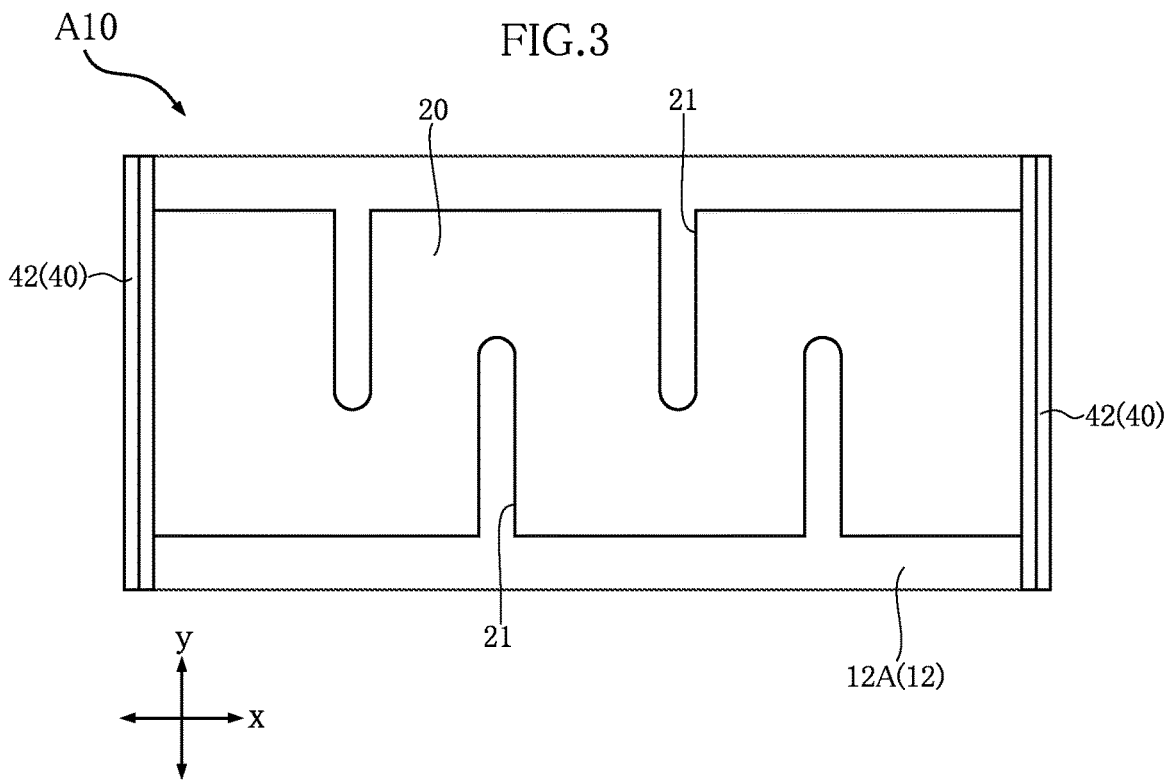
FIG. 3 is a plan view corresponding to FIG. 1 and seen through a first insulator and the covering body.

With reference to FIGS. 1 to 9, a resistor A10 according to a first embodiment of the present disclosure will be described. The resistor A10 is intended for a shunt resistor used for current detection. The resistance of the resistor A10 is approximately 5 mΩ to 220 mΩ. The resistor A10 is surface-mounted on any of the wiring boards of various electronic devices. The resistor A10 includes a first insulator 11, a resistive body 20, a second insulator 12, a covering body 30, and a pair of electrodes 40. For convenience of understanding, FIG. 2 is shown through a second layer 32 (described below) of the covering body 30. For convenience of understanding, FIG. 3 is shown through the first insulator 11 and the covering body 30.

In the description of the resistor A10, the thickness direction of the first insulator 11 is referred to as a "thickness direction z" for convenience. The direction perpendicular to the thickness direction z is referred to as a "first direction x". The direction perpendicular to both of the thickness direction z and the first direction x is referred to as a "second direction y". The "thickness direction z", the "first direction x", and the "second direction y" are also applied to the description of resistors A20 to A40 described below. As shown in FIG. 1, the resistor A10 is rectangular as viewed along the thickness direction z. In the resistor A10, the first direction x corresponds to the longitudinal direction of the resistor A10 as viewed in the thickness direction z.

Figure 6:
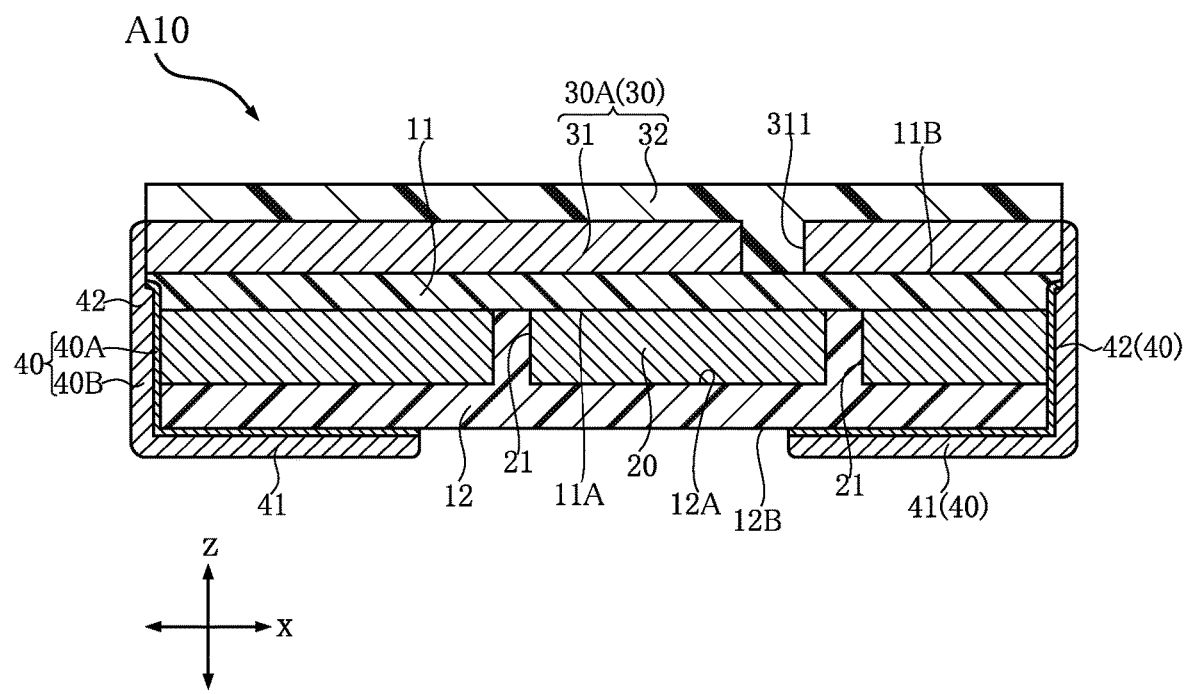
FIG. 6 is a cross-sectional view along line VI-VI of FIG. 2.

As shown in FIG. 6, the resistive body 20 is arranged on the first insulator 11. The first insulator 11 is a synthetic resin sheet made of epoxy resin or the like. The first insulator 11 has electrical insulation and flexibility. The first insulator 11 contains fillers 112 that are electrically insulative. The fillers 112 are made of a material containing ceramics having a relatively high thermal conductivity, such as alumina ($Al_2O_3$) and boron nitride (BN).

As shown in FIG. 6, the first insulator 11 has a first obverse surface 11A and a first reverse surface 11B. The first obverse surface 11A faces the side of the thickness direction z at which the resistive body 20 is arranged with respect to the first insulator 11. The first reverse surface 11B faces opposite from the first obverse surface 11A. The first insulator 11 has a thickness (length from the first obverse surface 11A to the first reverse surface 11B in the thickness direction z) of 40 µm to 60 µm.

Figure 7:
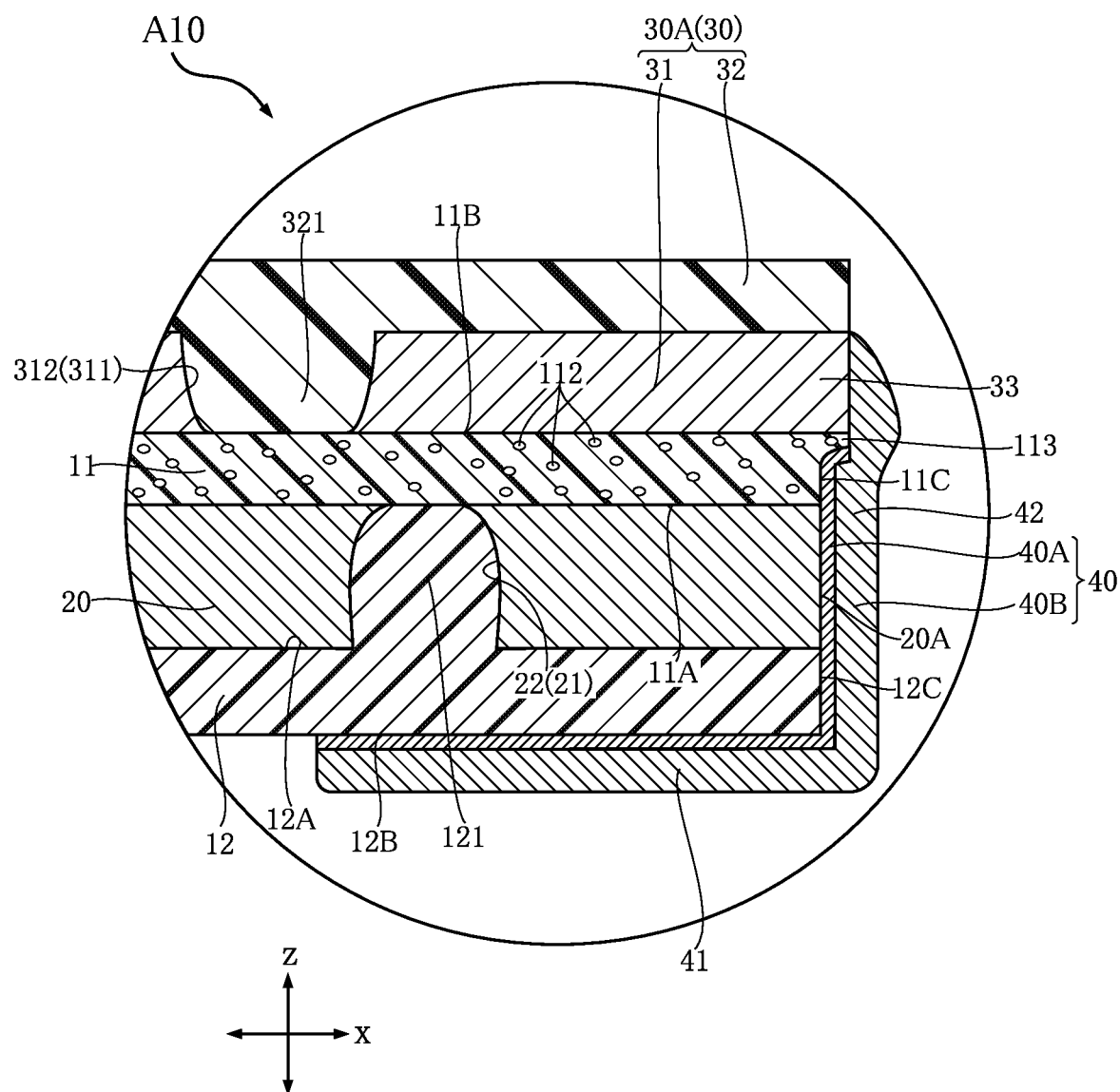
FIG. 7 is a partially enlarged view of FIG. 6.

As shown in FIG. 6, the resistive body 20 is a passive element arranged on the first obverse surface 11A of the first insulator 11. Examples of the material for the resistive body include a copper (Cu)-manganese (Mn)-nickel (Ni) alloy (Manganin®), and a copper-manganese-tin (Sn) alloy (Zeranin®). The resistive body 20 has a thickness of 50 µm to 150 µm. As shown in FIGS. 3 and 6, the resistive body 20 is provided with a plurality of resistive slits 21 that penetrate through in the thickness direction z. The plurality of resistive slits 21 are provided to set the resistance of the resistive body 20 to a predetermined value. The plurality of resistive slits 21 extend in the second direction y. Both ends of the resistive body 20 in the second direction y are partially open due to the plurality of resistive slits 21. The plurality of resistive slits 21 cause the resistive body 20 to have a meandering shape relative to the first direction x, as viewed along the thickness direction z. As shown in FIG. 7, side walls 22 of the plurality of resistive slits 21 are recessed toward the inside of the resistive body 20.

As shown in FIGS. 3 to 6, the second insulator 12 covers the resistive body 20. The second insulator 12 is a synthetic resin sheet made of epoxy resin or the like. The second insulator 12 has a second obverse surface 12A and a second reverse surface 12B. The second obverse surface 12A faces the side of the thickness direction z at which the first insulator 11 is arranged with respect to the second insulator 12. The second insulator 12 has a thickness (length from the second obverse surface 12A to the second reverse surface 12B in the thickness direction z) of 40 µm to 60 µm. The second obverse surface 12A is in contact with the surface of the resistive body 20. As such, the resistive body 20 is sandwiched between the second obverse surface 12A and the first obverse surface 11A of the first insulator 11. The second reverse surface 12B faces opposite from the second obverse surface 12A. The second reverse surface 12B is partially exposed.

As shown in FIG. 7, the second insulator 12 is provided with a plurality of embedded portions 121. The plurality of embedded portions 121 protrude from the second obverse surface 12A in the thickness direction z. The plurality of embedded portions 121 are positioned in the plurality of resistive slits 21 of the resistive body 20. In the resistor A10, each of the plurality of embedded portions 121 is in contact with the side walls 22 of the resistive slit 21.

Figure 8:
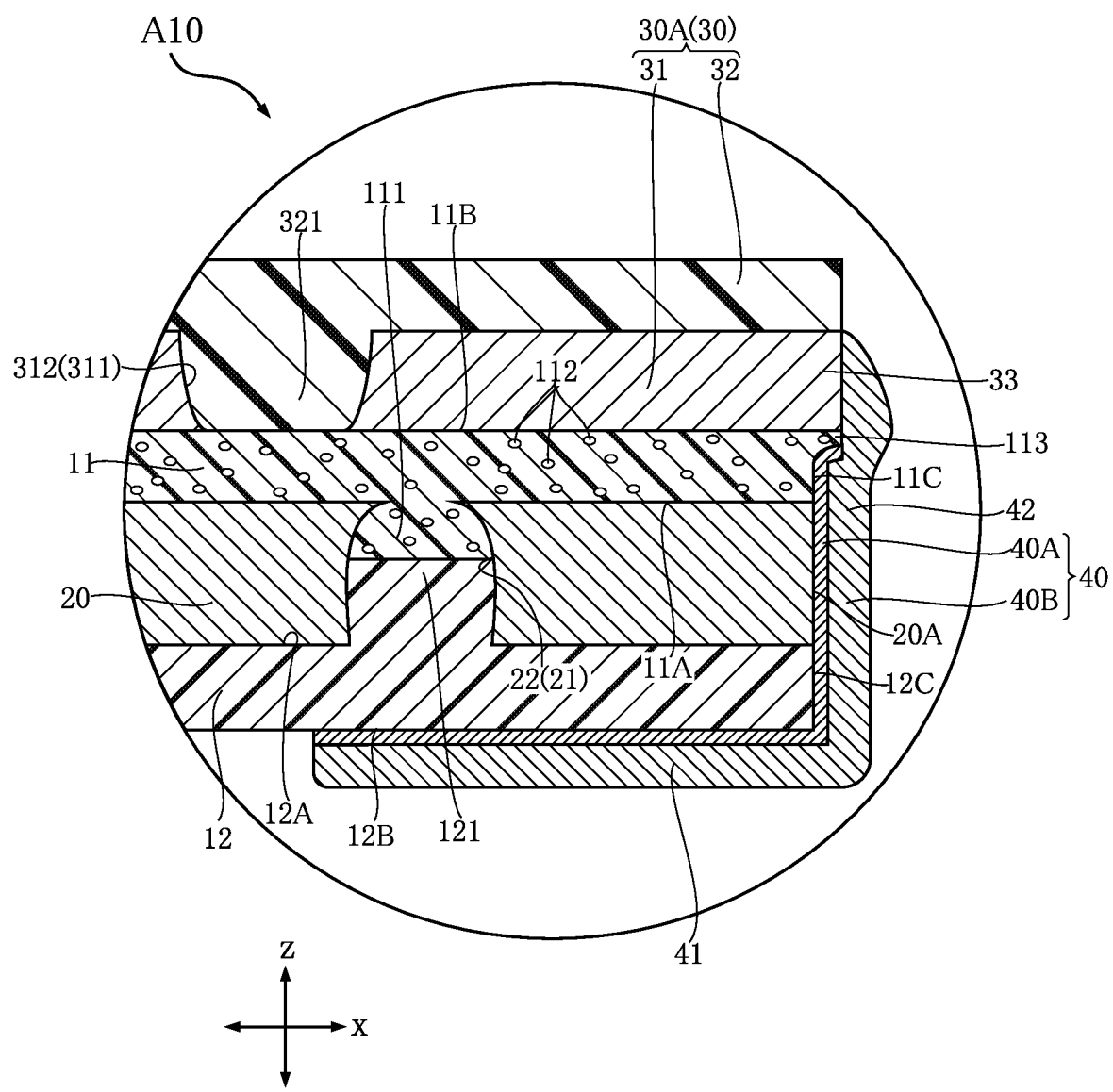
FIG. 8 is a partially enlarged view of FIG. 6.

FIG. 8 shows an example where the plurality of embedded portions 121 of the second insulator 12, as well as a plurality of embedded portions 111 provided for the first insulator 11, are positioned within the plurality of resistive slits 21 of the resistive body 20. The plurality of embedded portions 111 protrude from the first obverse surface 11A of the first insulator 11 in the thickness direction z. In the resistor A10, each of the plurality of embedded portions 111 is in contact with the side walls 22 of the resistive slit 21 and the embedded portion 121. In this way, at least one of the first insulator 11 and the second insulator 12 is partially positioned within the resistive slits 21.

The covering body 30 is formed on the first reverse surface 11B of the first insulator 11 in the resistor A10, as shown in FIG. 6. The covering body 30 includes a first covering body 30A and a second covering body 30B. The first covering body 30A refers to the covering body 30 that is formed on the first insulator 11. The second covering body 30B refers to the covering body 30 that is formed on the second insulator 12. The resistor A10 includes the first covering body 30A of the covering body 30.

Figure 5:
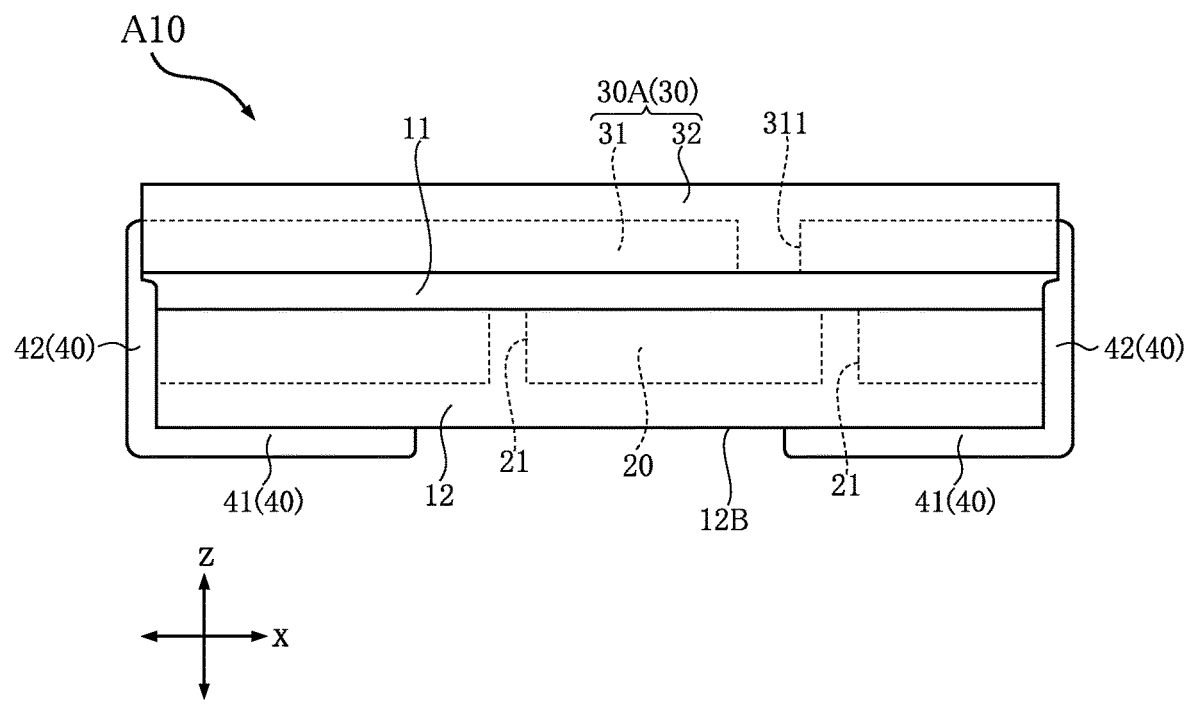
FIG. 5 is a front view of the resistor shown in FIG. 1.

As shown in FIGS. 5 and 6, the first covering body 30A (covering body 30) has a first layer 31 and a second layer 32. As shown in FIGS. 2 and 6, the first layer 31 is in contact with the first reverse surface 11B of the first insulator 11. The first layer 31 has electrical conductivity. The first layer 31 is made of a material that contains copper. The first layer 31 is preferably made of a material that has a relatively low electrical resistivity and a relatively high thermal conductivity. The first layer 31 has a thickness of 70 µm to 90 µm. Accordingly, the first layer 31 is thicker than each of the first insulator 11 and the second insulator 12. As shown in FIGS. 1 and 6, the second layer 32 is formed on the first layer 31. The second layer 32 is a synthetic resin sheet that is electrically insulative. The second layer 32 may be a synthetic resin sheet made of glass epoxy resin.

As shown in FIGS. 2 and 6, the first layer 31 is provided with a slit 311 that extends through in the thickness direction z. The slit 311 splits the first layer 31 into multiple areas. In addition, both ends of the first layer 31 in the second direction y are partially open. In the resistor A10, the slit 311 is inclined relative to the first direction x, as viewed along the thickness direction z. The slit 311 passes through a center C of the first covering body 30A, as viewed along the thickness direction z. The center C of the first covering body 30A refers to the intersection of the diagonal lines of the first covering body 30A, as viewed along the thickness direction z. As shown in FIG. 7, side walls 312 of the slit 311 are recessed toward the inside of the first layer 31.

As shown in FIG. 7, the second layer 32 is provided with an embedded portion 321. The embedded portion 321 protrudes in the thickness direction z from the surface of the second layer 32 that is in contact with the first layer 31. The embedded portion 321 is positioned in the slit 311 of the first layer 31. In this way, the second layer 32 is partially positioned within the slit 311. In the resistor A10, the embedded portion 321 is in contact with the side walls 312 of the slit 311.

As shown in FIG. 6, the pair of electrodes 40 are electrically connected to the resistive body 20 on both sides in the first direction x. Each of the pair of electrodes 40 includes a base layer 40A and a plating layer 40B. As shown in FIGS. 6 and 7, in the resistor A10, the base layer 40A is in contact with the first insulator 11, the resistive body 20, and the second insulator 12. An example of the base layer 40A is a nickel-chromium (Cr) alloy. The plating layer 40B covers the base layer 40A. In the resistor A10, the plating layer 40B is a metal layer consisting of copper, nickel, and tin that are formed in the stated order from the part that is in contact with the base layer 40A.

Figure 4:
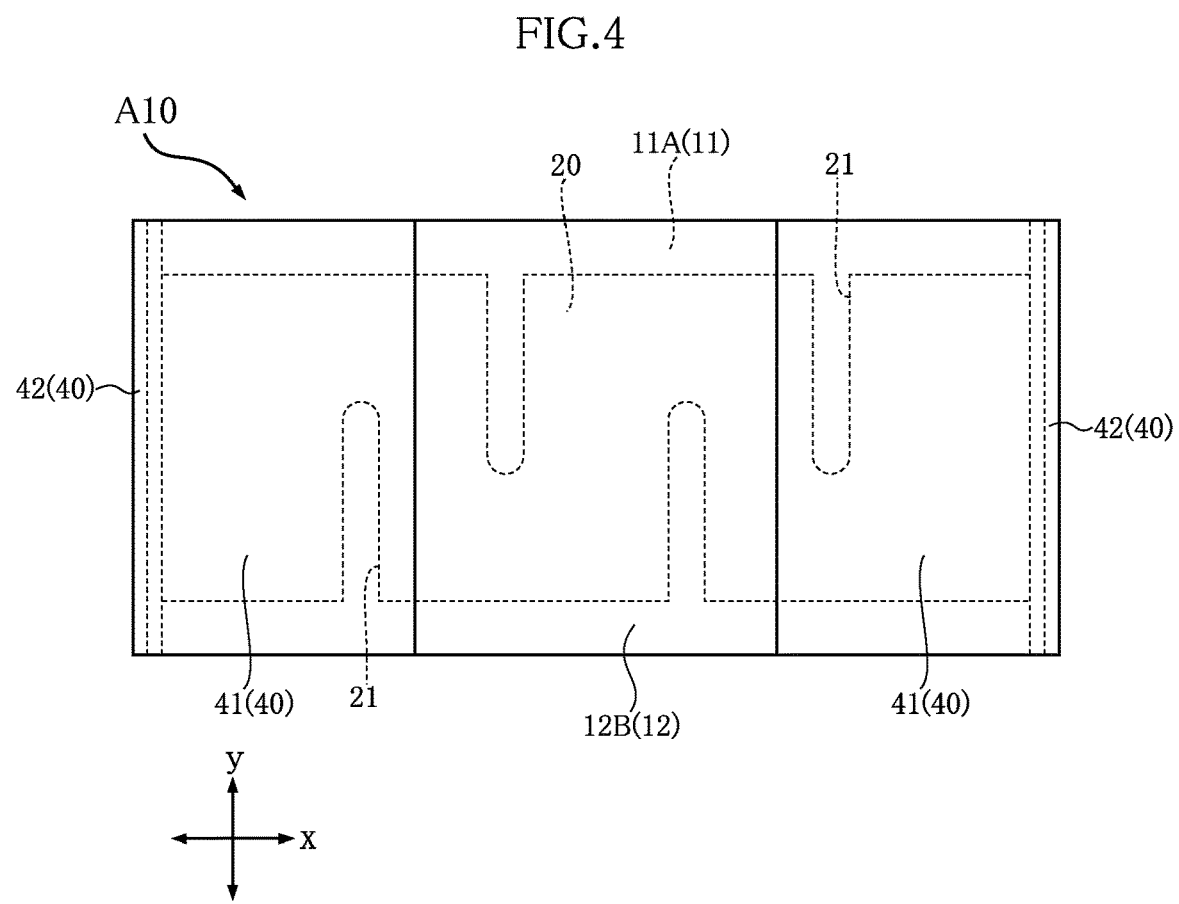
FIG. 4 is a bottom view of the resistor shown in FIG. 1.

As shown in FIGS. 4 to 6, each of the pair of electrodes 40 has a bottom portion 41 and a side portion 42. Each of the bottom portion 41 and the side portion 42 includes the base layer 40A and the plating layer 40B. The bottom portion 41 is positioned opposite from the resistive body 20 with respect to the second insulator 12 in the thickness direction z. As shown in FIG. 4, the bottom portion 41 overlaps with the first obverse surface 11A of the first insulator 11, as viewed along the thickness direction z. In the resistor A10, the bottom portion 41 is in contact with the second reverse surface 12B of the second insulator 12.

As shown in FIGS. 4 to 6, the side portion 42 is connected to the bottom portion 41 and extends in the thickness direction z. As shown in FIG. 7, the resistive body 20 has a pair of first end surfaces 20A facing in the first direction x. The pair of side portions 42 are in contact with the pair of first end surfaces 20A. This allows the pair of electrodes 40 to electrically connect to the resistive body 20. The second insulator 12 has a pair of second end surfaces 12C facing in the first direction x. The first insulator 11 has a pair of third end surfaces 11C facing in the first direction x. The pair of second end surfaces 12C and the pair of third end surfaces 11C are flush with the pair of first end surfaces 20A. The pair of side portions 42 are also in contact with the pair of second end surfaces 12C and the pair of third end surfaces 11C.

Figure 9:
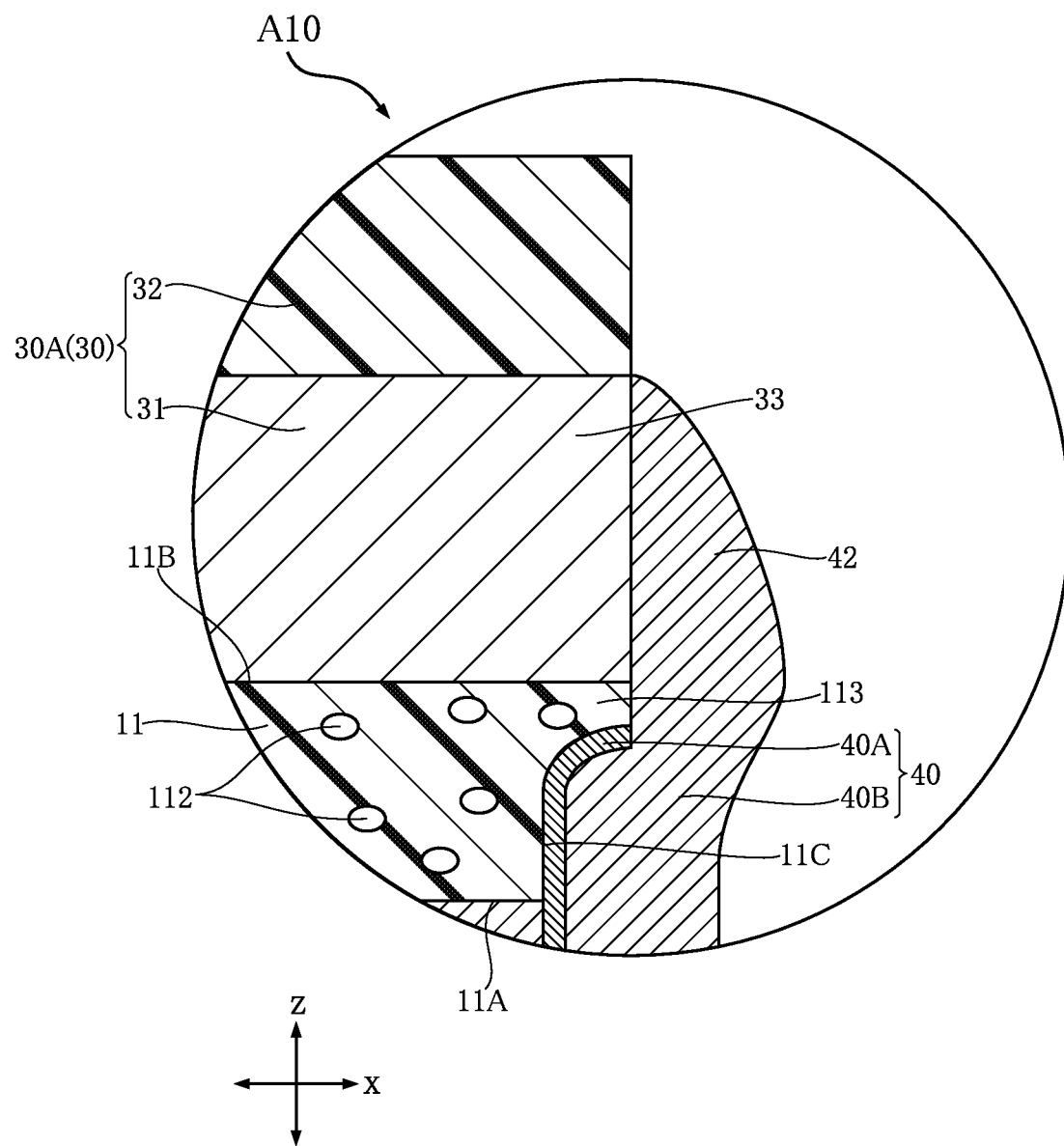
FIG. 9 is a partially enlarged view of FIG. 7.

As shown in FIG. 7, the first covering body 30A has a pair of first protrusions 33. The first insulator 11 has a pair of second protrusions 113. The pair of first protrusions and the pair of second protrusions 113 protrude in the first direction x from the pair of first end surfaces 20A of the resistive body 20. In the resistor A10, the pair of first protrusions 33 are formed of the first layer 31 and the second layer 32. As shown in FIG. 9, the pair of side portions 42 are in contact with both the pair of first protrusions 33 and the pair of second protrusions 113. The plating layers 40B of the pair of side portions 42 are in contact with portions, of the pair of first protrusions 33, that are formed of the first layer 31.

The following describes an example of a method for manufacturing the resistor A10, with reference to FIGS. 10 to 16. Note that the cross-sectional positions shown in FIGS. 10 to 16 are the same as the cross-sectional position shown in FIG. 6.

Figure 10:
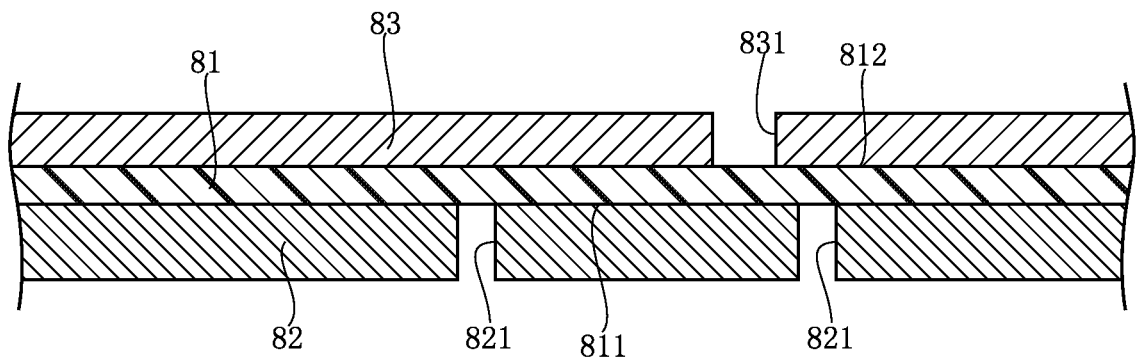
FIG. 10 is a cross-sectional view illustrating a manufacturing step of the resistor shown in FIG. 1.

First, as shown in FIG. 10, a resistive body 82 and a first covering layer 83 are arranged on a first insulator 81. The first insulator 81 has an obverse surface 811 and a reverse surface 812 that face opposite from each other in the thickness direction z. The first insulator 81, the resistive body 82, and the first covering layer 83 correspond to the first insulator 11, the resistive body 20, and the first layer (the first covering body 30A) of the resistor A10, respectively. The resistive body 82 is press-bonded to the obverse surface 811 to be arranged on the first insulator 81. The first covering layer 83 is press-bonded to the reverse surface 812 to be arranged on the resistive body 82. The resistive body 82 is provided with a plurality of resistive slits 821 that extend through in the thickness direction z. The first covering layer 83 is provided with a slit 831 that extends through in the thickness direction z. The plurality of resistive slits 821 and the slit 831 are formed by wet etching.

Figure 11:
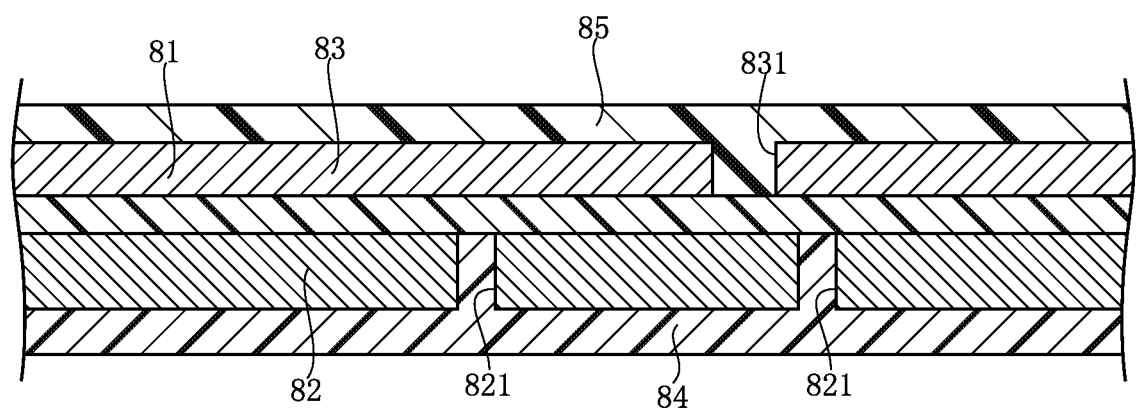
FIG. 11 is a cross-sectional view illustrating a manufacturing step of the resistor shown in FIG. 1.

Next, as shown in FIG. 11, a second insulator 84 is formed on the resistive body 82. The second insulator 84 corresponds to the second insulator 12 of the resistor A10. The second insulator 84 is press-bonded to the resistive body 82 to be formed thereon. This step allows portions of the second insulator 84 to be positioned within the plurality of resistive slits 821 of the resistive body 82. The step also includes laminating a second covering layer 85 on the first covering layer 83. The second covering layer 85 corresponds to the second layer 32 (the first covering body 30A) of the resistor A10. The second covering layer 85 is press-bonded to the first covering layer 83 to be formed thereon. This step allows a part of the second covering layer 85 to be positioned within the slit 831 of the first covering layer 83.

Figure 12:
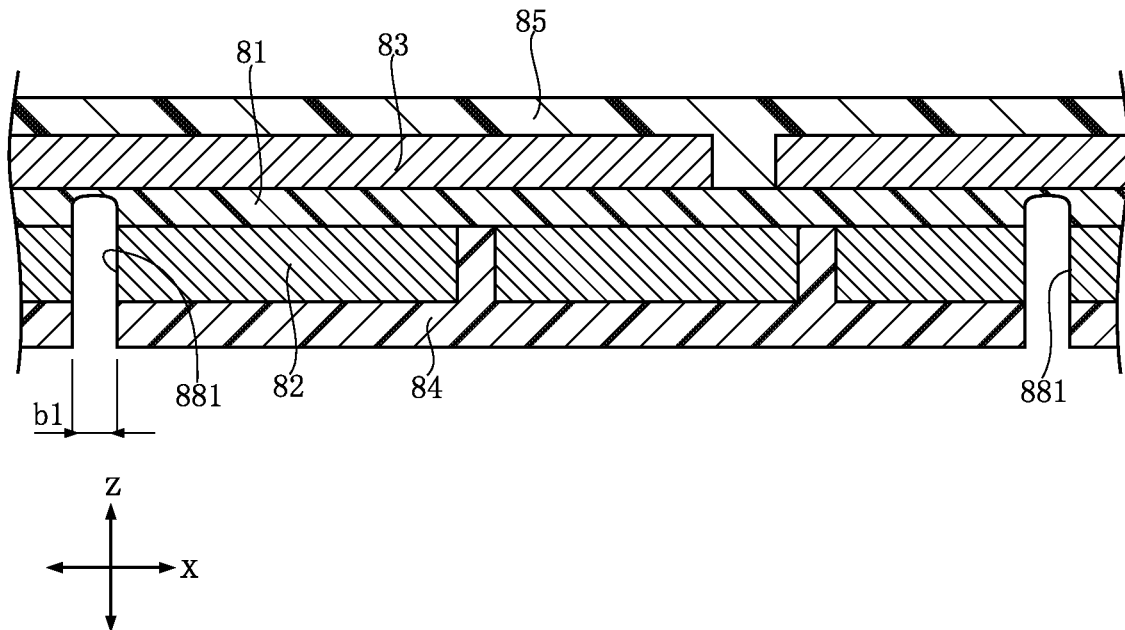
FIG. 12 is a cross-sectional view illustrating a manufacturing step of the resistor shown in FIG. 1.

Next, as shown in FIG. 12, a plurality of grooves 881, which are recessed from the second insulator 84 in the thickness direction z, are formed. The plurality of grooves 881 are formed along the second direction y. The plurality of grooves 881 are formed by using a dicing blade, for example. As a result of forming the plurality of grooves 881, respective parts of the second insulator 84, the resistive body 82, and the first insulator 81 are removed. Out of these elements, the plurality of grooves 881 extend through the second insulator 84 and the resistive body 82 in the thickness direction z. Each of the plurality of grooves 881 has a width b1 (i.e., the dimension of each groove 881 in the first direction x).

Figure 13:
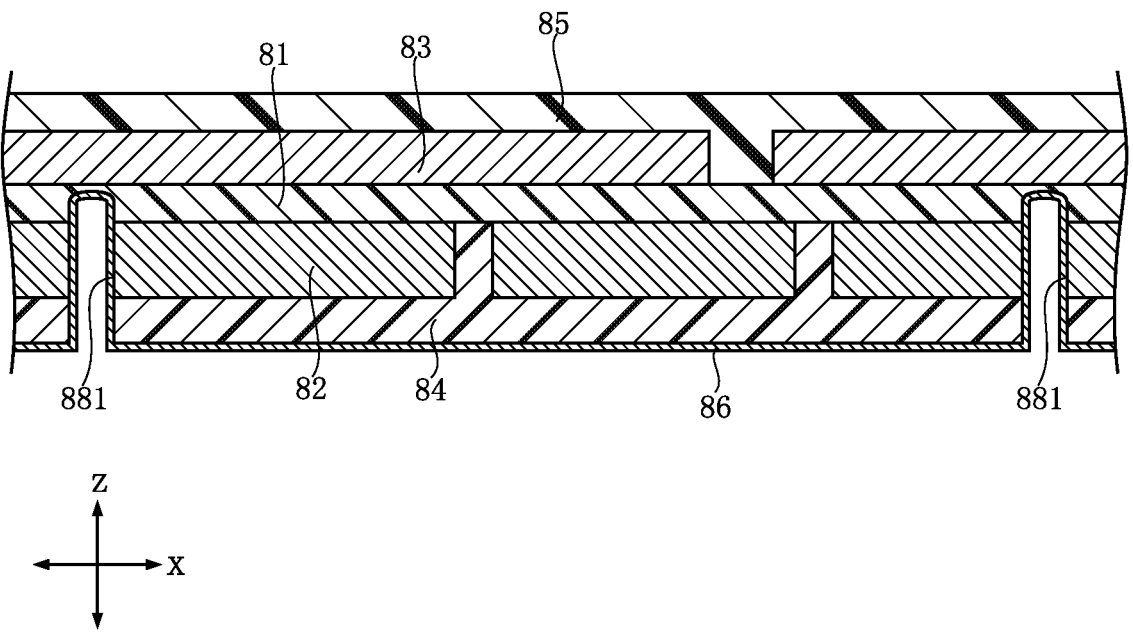
FIG. 13 is a cross-sectional view illustrating a manufacturing step of the resistor shown in FIG. 1.

Next, as shown in FIG. 13, a base layer 86 is formed to cover the surfaces of the second insulator 84 and the plurality of grooves 881. The base layer 86 corresponds to the base layers 40A of the pair of electrodes 40 in the resistor A10. The base layer 86 is formed by a sputtering method.

Figure 14:
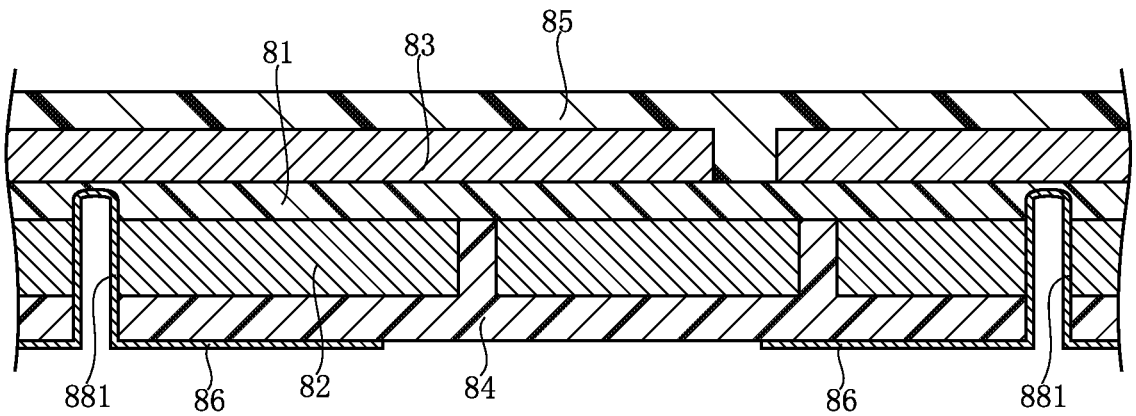
FIG. 14 is a cross-sectional view illustrating a manufacturing step of the resistor shown in FIG. 1.

Next, as shown in FIG. 14, the base layer 86 that covers the surface of the second insulator 84 is partially removed. The removal of a part of the base layer 86 is achieved by first forming a mask on the base layer 86 and then performing wet etching on a part of the base layer 86 that is not covered with the mask. The second insulator 84 is exposed from where the part of the base layer 86 has been removed.

Figure 15:
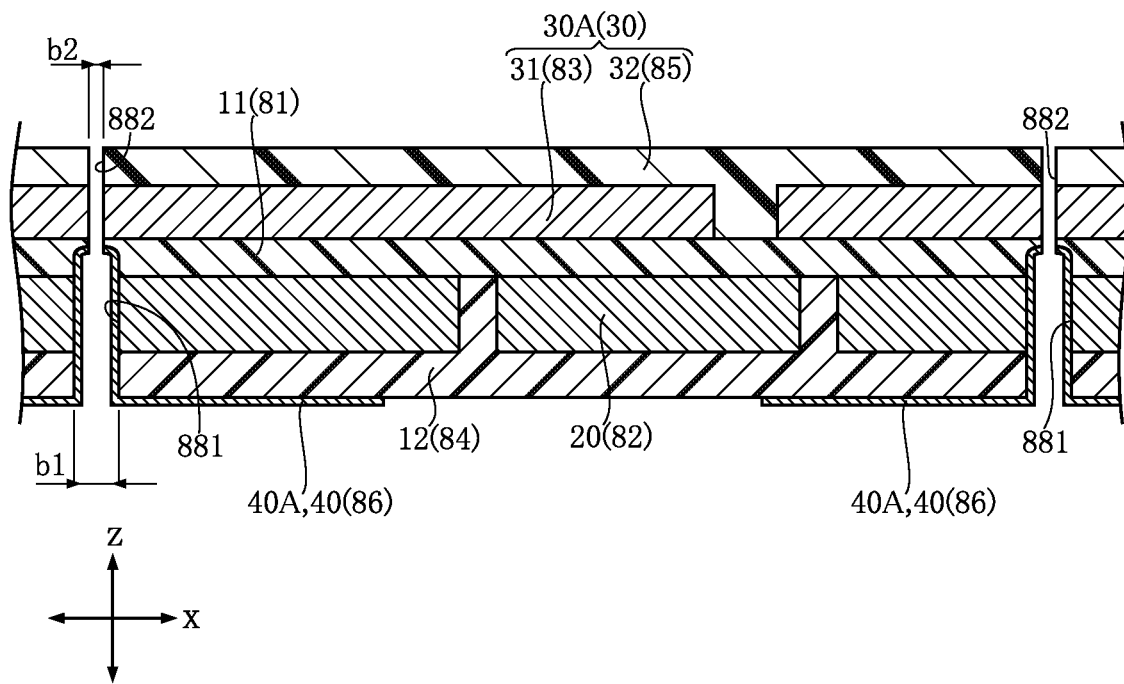
FIG. 15 is a cross-sectional view illustrating a manufacturing step of the resistor shown in FIG. 1.

Next, as shown in FIG. 15, a plurality of slits 882 are formed. The plurality of slits 882 are formed in a lattice pattern along the first direction x and the second direction y. Some of the plurality of slits 882, which are along the second direction y, are formed in the thickness direction z from the base layer 86 that covers the bottoms of the plurality of grooves 881. The plurality of slits 882 are formed by using a dicing blade, for example. Each of the plurality of slits 882 has a width b2 (the dimension of each slit 882 in the first direction x). The width b2 is smaller than the width b1 of each groove 881. With this step, the first insulator 81, the resistive body 82 formed on the first insulator 81, the first covering layer 83, the second insulator 84, the second covering layer 85, and the base layer 86 are divided into individual pieces. In other words, forming of the first insulator 11, the second insulator 12, the resistive body 20, the first covering body 30A (covering body 30), and the base layers 40A of the pair of electrodes 40 of the resistor A10 has been completed.

Figure 16:
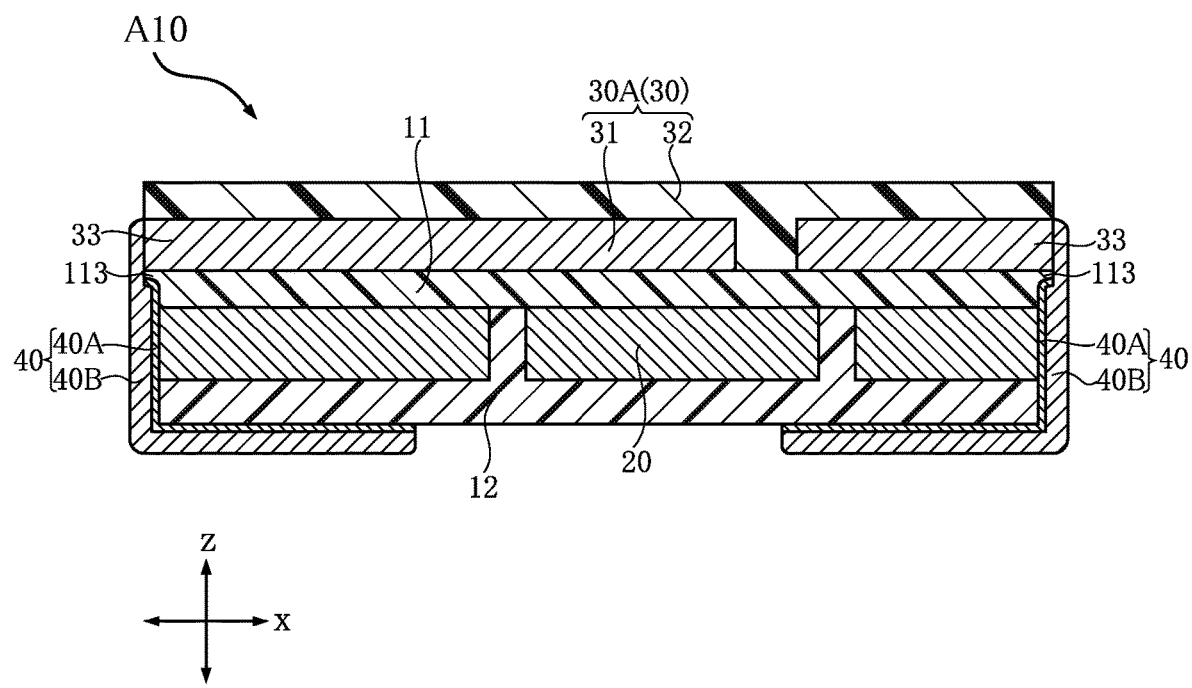
FIG. 16 is a cross-sectional view illustrating a manufacturing step of the resistor shown in FIG. 1.

Finally, as shown in FIG. 16, a pair of plating layers 40B covering the pair of base layers 40A are formed. The pair of plating layers 40B are formed by electrolytic barrel plating. With this step, forming of the pair of electrodes 40 of the resistor A10 has been completed. Furthermore, this step allows the pair of first protrusions 33 of the first covering body 30A and the pair of second protrusions 113 of the first insulator 11 to be covered with the pair of plating layers 40B. The resistor A10 is manufactured through the above steps.

<First Variation>

Figure 17:
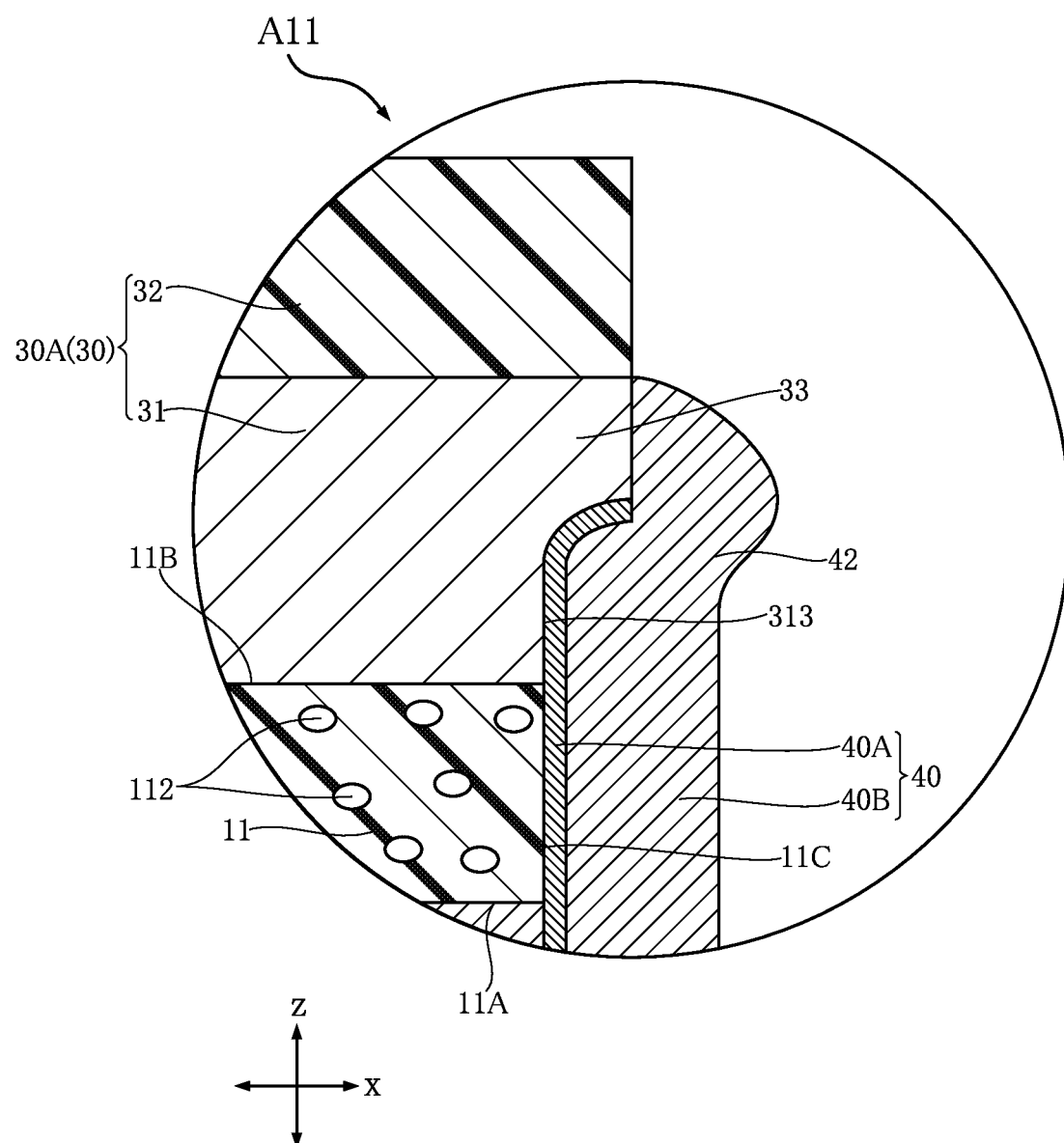
FIG. 17 is a partially enlarged cross-sectional view of a resistor according to a first variation of the first embodiment of the present disclosure.

With reference to FIG. 17, a resistor A11 according to a first variation of the resistor A10 is described. The resistor A11 is different from the resistor A10 described above in the structures of the first insulator 11, the first covering body 30A (covering body 30), and the pair of electrodes 40.

Unlike the resistor A10, the first insulator 11 is not provided with the pair of second protrusions 113. The first layer 31 of the first covering body 30A has a pair of fourth end surfaces 313 facing in the first direction x. The pair of fourth end surfaces 313 are flush with the pair of third end surfaces 11C of the first insulator 11. The pair of fourth end surfaces 313 are in contact with the side portions 42 of the pair of electrodes 40.

The pair of first protrusions 33 of the first covering body 30A are formed of the first layer 31 and the second layer 32. Parts of the pair of first protrusions 33 that are formed of the first layer 31 protrude in the first direction x from the pair of fourth end surfaces 313. The side portions 42 of the pair of electrodes 40 are in contact with the parts, of the pair of first protrusions 33, that are formed of the first layer 31.

The structure of the resistor A11 is obtained by forming, during the step of forming the plurality of grooves 881 shown in FIG. 12, the plurality of grooves 881 to be deeper than the plurality of grooves 881 formed in the manufacturing of the resistor A10.

<Second Variation>

Figure 18:
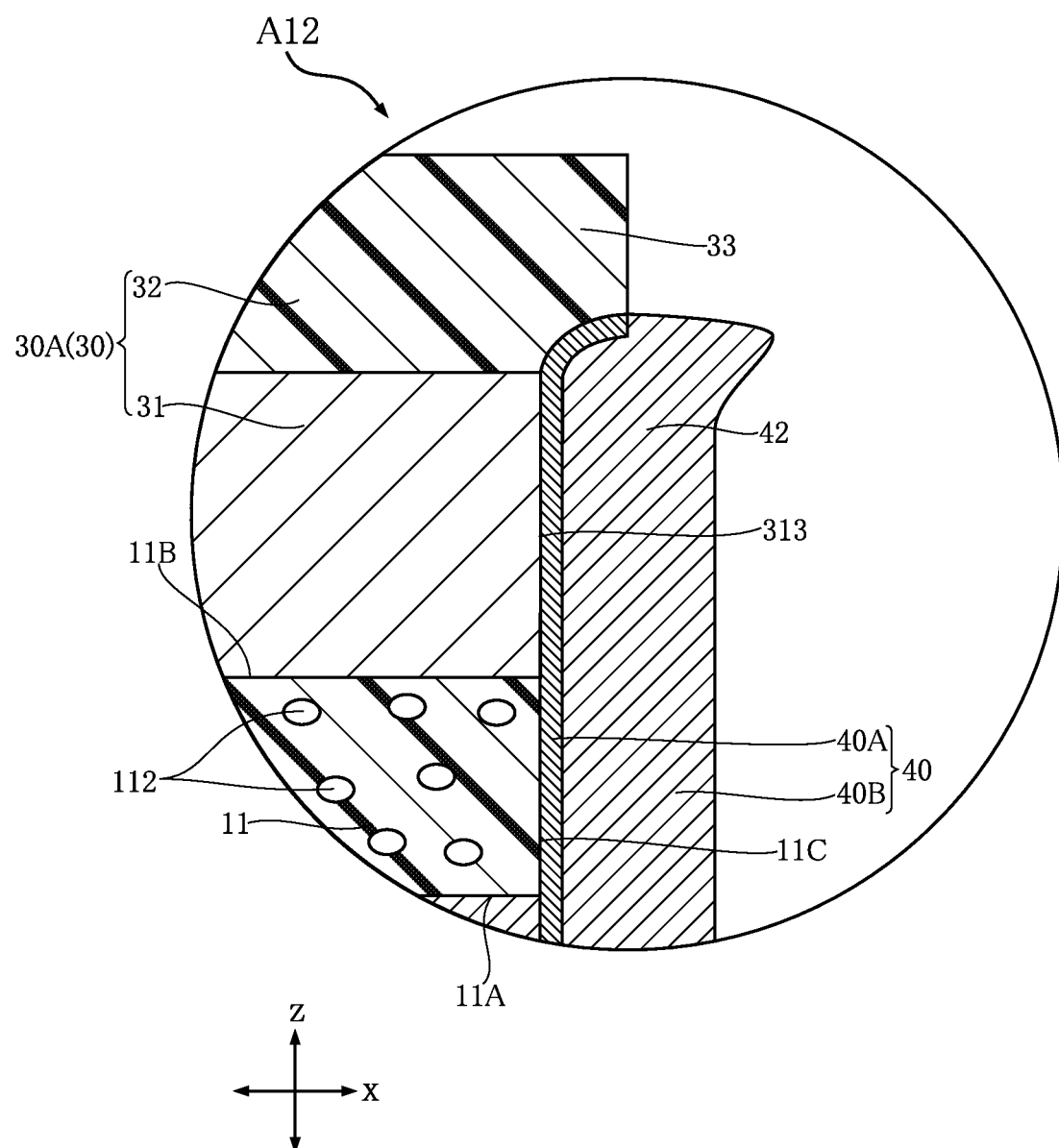
FIG. 18 is a partially enlarged cross-sectional view of a resistor according to a second variation of the first embodiment of the present disclosure.

With reference to FIG. 18, a resistor A12 according to a second variation of the resistor A10 is described. The resistor A12 is different from the resistor A10 described above in the structures of the first insulator 11, the first covering body 30A (covering body 30), and the pair of electrodes 40.

Unlike the resistor A10, the first insulator 11 is not provided with the pair of second protrusions 113. The first layer 31 of the first covering body 30A has a pair of fourth end surfaces 313 facing in the first direction x. The dimension of each of the pair of fourth end surfaces 313 in the thickness direction z is larger than the dimension of each of the pair of fourth end surfaces 313 of the resistor A11. The pair of fourth end surfaces 313 are in contact with the side portions 42 of the pair of electrodes 40.

The pair of first protrusions 33 of the first covering body 30A are formed of the second layer 32. The side portions 42 of the pair of electrodes 40 are in contact with the pair of first protrusions 33 that are formed of the second layer 32.

The structure of the resistor A12 is obtained by forming, during the step of forming the plurality of grooves 881 shown in FIG. 12, the plurality of grooves 881 to be deeper than the plurality of grooves 881 formed in the manufacturing of the resistor A11.

<Third Variation>

With reference to FIG. 19, a resistor A13 according to a third variation of the resistor A10 is described. The resistor A13 is different from the resistor A10 described above in the structure of the first layer 31 of the first covering body 30A (covering body 30).

In the resistor A13, the slit 311 of the first layer 31 is inclined relative to the first direction x, as viewed along the thickness direction z. The slit 311 passes through the center C of the first covering body 30A and is bent at the center C, as viewed along the thickness direction z. Accordingly, the direction of inclination of the slit 311 relative to the first direction x is reversed at the center C. Although not shown in figures, the side walls 312 of the slit 311 are also recessed toward the inside of the first layer 31.

<Fourth Variation>

With reference to FIG. 20, a resistor A14 according to a fourth variation of the resistor A10 is described. The resistor A14 is different from the resistor A10 described above in the structure of the first layer 31 of the first covering body 30A (covering body 30).

In the resistor A14, the slit 311 of the first layer 31 has a first slit 311A and a plurality of second slits 311B, as viewed along the thickness direction z. The first slit 311A extends in the first direction x. The plurality of second slits 311B are connected to the respective ends of the first slit 311A in the first direction x, and extend in the second direction y. Accordingly, the slit 311 has a crank shape as viewed along the thickness direction z. The first slit 311A passes through the center C of the first covering body 30A, as viewed along the thickness direction z. Although not shown in figures, the side walls 312 of the slit 311 in the resistor A14 are also recessed toward the inside of the first layer 31.

<Fifth Variation>

Figure 21:
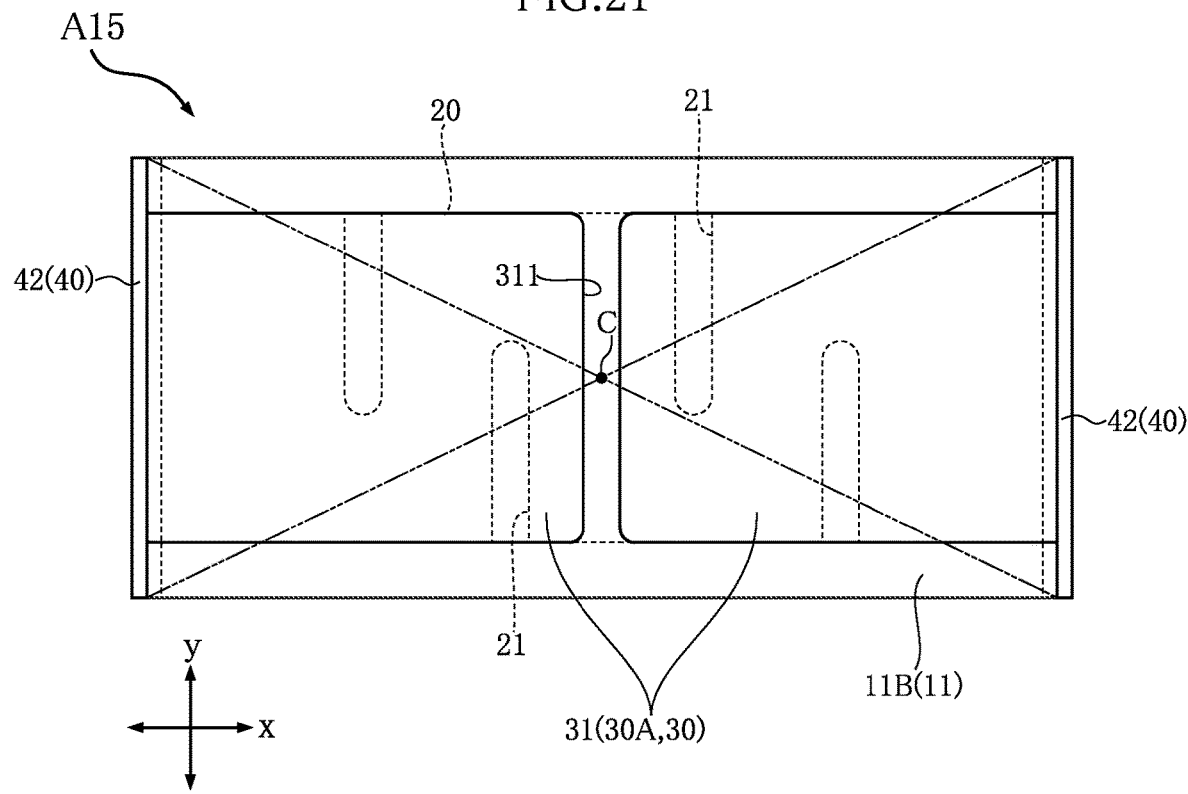
FIG. 21 is a plan view of a resistor (seen though a second layer of a covering body) according to a fifth variation of the first embodiment of the present disclosure.

With reference to FIG. 21, a resistor A15 according to a fifth variation of the resistor A10 is described. The resistor A15 is different from the resistor A10 described above in the structure of the first layer 31 of the first covering body 30A (covering body 30).

In the resistor A15, the slit 311 of the first layer 31 extends in the second direction y, as viewed along the thickness direction z. The slit 311 passes through the center C of the first covering body 30A, as viewed along the thickness direction z. Although not shown in figures, the side walls 312 of the slit 311 in the resistor A15 are also recessed toward the inside of the first layer 31.

The following describes advantages of the resistor A10.

The resistor A10 includes the first covering body 30A (covering body 30) formed on the first insulator 11. The first covering body 30A has the first layer 31 that is in contact with the first insulator 11. The first layer 31 has electrical conductivity. As such, heat generated from the resistive body 20 during the use of the resistor A10 flows through both the first insulator 11 and the second insulator 12. The heat that has flowed through the first insulator 11 flows through the first covering body 30A. Since the first covering body 30A has the first layer 31, the first covering body 30A has a higher thermal conductivity than each of the first insulator 11 and the second insulator 12. As a result, heat generated from the resistive body 20 easily flows through the first covering body 30A. The heat that has flowed through the first covering body 30A is released to the outside of the resistor A10. Accordingly, the resistor A10 can improve heat dissipation property.

The first layer 31 is provided with the slit 311 that extends through in the thickness direction z. The first layer 31 is divided into a plurality of areas by the slit 311. The first layer 31 has a higher thermal expansion coefficient than each of the first insulator 11, the second insulator 12, and the resistive body 20. As such, when heat is generated from the resistive body 20, thermal stress tends to be concentrated between the first insulator 11 and the first covering body 30A. Too much concentration of the thermal stress causes a warp to be formed in the resistor A10 relative to the thickness direction z. The slit 311 in the first layer 31 can alleviate the thermal stress between the first insulator 11 and the first covering body 30A.

The first covering body 30A is provided with the pair of first protrusions 33 protruding from the pair of first end surfaces 20A of the resistive body 20 in the first direction x. Each of the pair of first protrusions 33 may be formed of both the first layer 31 and the second layer 32 as seen in the resistor A10 (see FIG. 9) and the resistor A11 (see FIG. 17), or may be formed of the second layer 32 as seen in the resistor A12 (see FIG. 18). In either case, the pair of electrodes 40 are electrically connected to the first layer 31 by the side portions 42 of the pair of electrodes 40 being in contact with the pair of first protrusions 33. Accordingly, it is possible to prevent a short circuit between the pair of electrodes 40 by providing the slit 311 in the first layer 31.

The first layer 31 is made of a material that contains copper. Copper has a relatively high thermal conductivity and a relatively low electric resistivity. This further improves the heat dissipation property of the resistor A10. Furthermore, it is possible to reduce variations in the resistance of the resistor A10 caused by the pair of electrodes 40 being in contact with the first layer 31.

The first insulator 11 contains the fillers 112 that are electrically insulative. The fillers 112 can further improve the mechanical strength of the first insulator 11. Also, the fillers 112 are made of a material containing ceramics having a relatively high thermal conductivity. This further increases the thermal conductivity of the first insulator 11. Accordingly, heat generated from the resistive body 20 can be transferred in a larger amount to the first covering body 30A via the first insulator 11, and this further improves the heat dissipation property of the resistor A10.

The first covering body 30A has the second layer 32 that is formed on the first layer 31 and electrically insulative. This can protect the first layer 31 and prevent a current from leaking outside the first layer 31. A part of the second layer 32 is positioned within the slit 311 of the first layer 31. This increases the area of contact between the second layer 32 and the first layer 31, thus improving the bonding strength of the second layer 32 to the first layer 31.

The side walls 312 of the slit 311 in the first layer 31 are recessed toward the inside of the first layer 31. This allows the slit 311 to produce an anchoring effect with respect to the second layer 32, thus further improving the bonding strength of the second layer 32 to the first layer 31.

The resistive body 20 is provided with the plurality of resistive slits 21 that extend through in the thickness direction z. At least part of the first insulator 11 or the second insulator 12 are positioned within the resistive slits 21. As a result, the area of contact between the resistive body 20 and at least one of the first insulator 11 and the second insulator 12 increases, thus improving the bonding strength of the at least one of the first and second insulators 11, 12 to the resistive body 20.

The side walls 22 of the resistive slits 21 of the resistive body 20 are recessed toward the inside of the resistive body 20. This allows the resistive slits 21 to produce an anchoring effect with respect to at least one of the first insulator 11 and the second insulator 12, thus further improving the bonding strength of the at least one of the first and second insulators 11, 12 to the resistive body 20.

Each of the pair of electrodes 40 has the side portion 42 that is connected to the bottom portion 41 and that extends in the thickness direction z. The pair of side portions 42 are in contact with the pair of first end surfaces 20A of the resistive body 20, the pair of second end surfaces 12C of the second insulator 12, and the pair of third end surfaces 11C of the first insulator 11. The pair of second end surfaces 12C and the pair of third end surfaces 11C are flush with the pair of first end surfaces 20A. Accordingly, in the resistive body 20, only the pair of first end surfaces 20A are in contact with the pair of electrodes 40. The pair of first end surfaces 20A have the same size. This suppresses variations in the resistance of the resistor A10.

Second Embodiment

Figure 22:
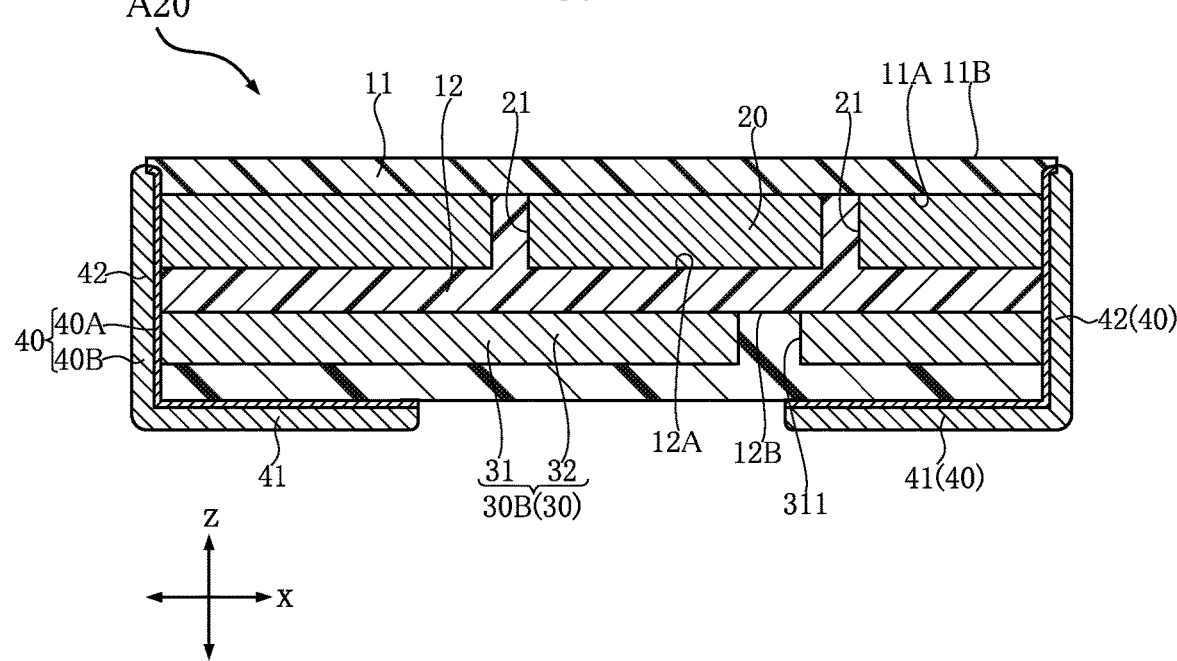
FIG. 22 is a cross-sectional view of a resistor according to a second embodiment of the present disclosure.
Figure 23:
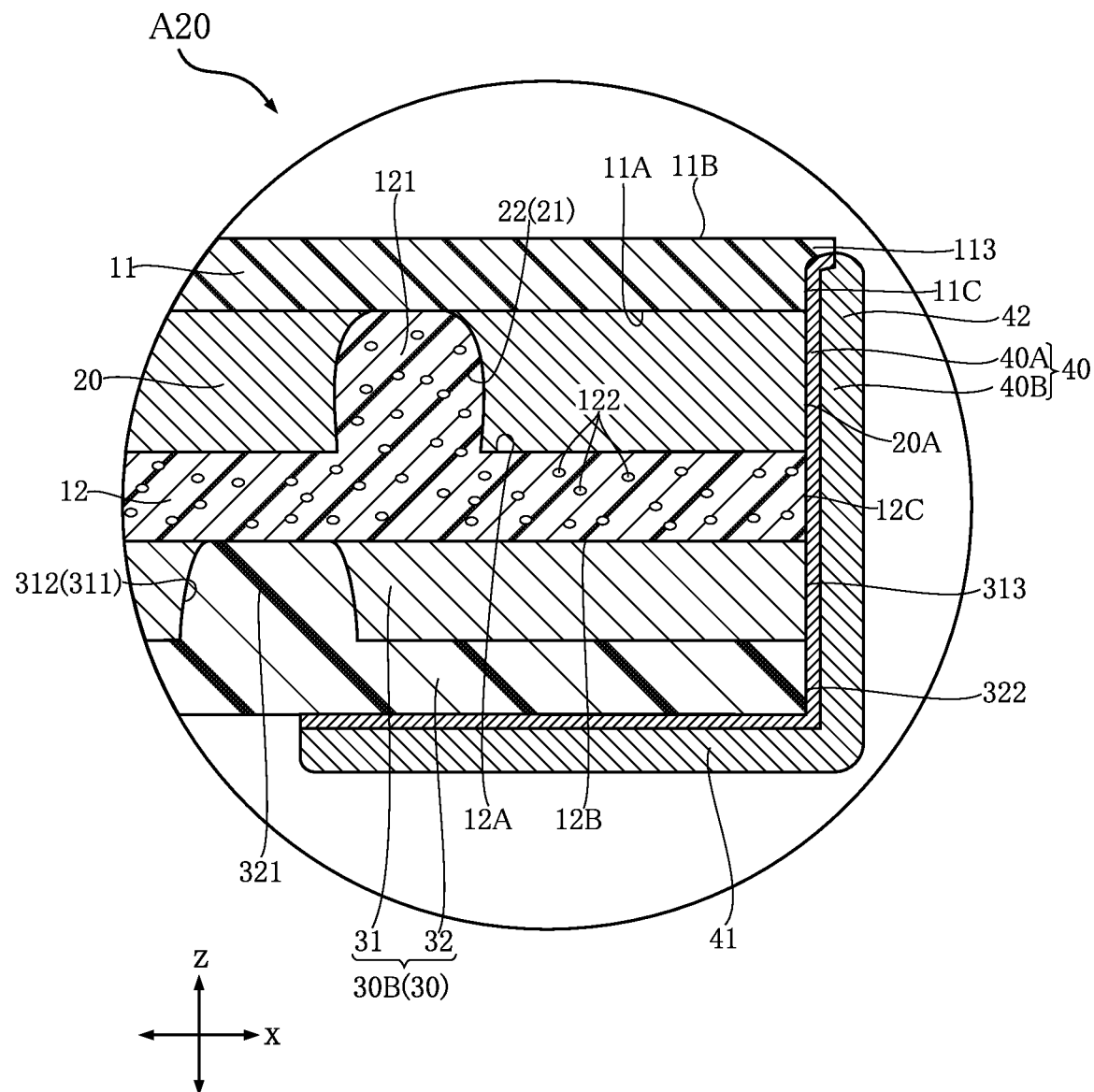
FIG. 23 is a partially enlarged view of FIG. 22.

With reference to FIGS. 22 to 23, a resistor A20 according to a second embodiment of the present disclosure will be described. In these figures, elements that are the same as or similar to the elements of the resistor A10 described above are provided with the same reference signs, and descriptions thereof are omitted. Note that the cross-sectional position shown in FIG. 22 is the same as the cross-sectional position shown in FIG. 6.

The resistor A20 is different from the resistor A10 described above in the structures of the first insulator 11, the second insulator 12, the covering body 30, and the pair of electrodes 40.

As shown in FIG. 23, the second insulator 12 contains fillers 122 that are electrically insulative. The fillers 122 are made of the same material as the fillers 112 contained in the first insulator 11 of the resistor A10 described above. Note that the first insulator 11 of the resistor A20 does not contain any fillers 112.

As shown in FIG. 22, the covering body 30 is formed on the second reverse surface 12B of the second insulator 12. As such, the resistor A20 includes the second covering body 30B of the covering body 30.

As shown in FIG. 22, the second covering body 30B has a first layer 31 and a second layer 32, as with the first covering body 30A. The first layer 31 is in contact with the second reverse surface 12B of the second insulator 12. The first layer 31 has electrical conductivity. The first layer is made of a material that contains copper. The first layer 31 is preferably made of a material that has a relatively low electrical resistivity and a relatively high thermal conductivity. The second layer 32 is formed on the first layer 31. The second layer 32 is a synthetic resin sheet that is electrically insulative. One example of the synthetic resin sheet contains glass epoxy resin.

As shown in FIG. 23, the first layer 31 is provided with a slit 311 that extends through in the thickness direction z. The slit 311 splits the first layer 31 into multiple areas. The slit 311 may have any shape selected from the slits in the resistor A10 (see FIG. 2), the resistor A13 (see FIG. 19), the resistor A14 (see FIG. 20), and the resistor A15 (see FIG. 21). The side walls 312 of the slit 311 are recessed toward the inside of the first layer 31.

As shown in FIG. 23, the second layer 32 is provided with an embedded portion 321. The embedded portion 321 protrudes in the thickness direction z from the surface of the second layer 32 that is in contact with the first layer 31. The embedded portion 321 is positioned in the slit 311 of the first layer 31. In this way, the second layer 32 is partially positioned within the slit 311. In the resistor A20, the embedded portion 321 is in contact with the side walls 312 of the slit 311.

As shown in FIG. 23, the first layer 31 has a pair of fourth end surfaces 313. The pair of fourth end surfaces 313 face in the first direction x. The second layer 32 has a pair of fifth end surfaces 322. The pair of fifth end surfaces 322 face in the first direction x. The pair of fourth end surfaces 313 and the pair of fifth end surfaces 322 are flush with the pair of first end surfaces 20A of the resistive body 20. In the resistor A20, the second covering body 30B is not provided with the pair of first protrusions 33.

As shown in FIGS. 22 and 23, the bottom portions 41 of the pair of electrodes 40 are in contact with the second layer 32 of the second covering body 30B. As shown in FIG. 23, the side portions 42 of the pair of electrodes 40 are in contact with the pair of first end surfaces 20A of the resistive body 20, the pair of second end surfaces 12C of the second insulator 12, and the pair of third end surfaces 11C of the first insulator 11. Furthermore, the pair of side portions 42 are in contact with the pair of fourth end surfaces 313 of the first layer 31 and the pair of fifth end surfaces 322 of the second layer 32. The pair of side portions 42 are in contact with the pair of second protrusions 113 of the first insulator 11.

The following describes advantages of the resistor A20.

The resistor A20 includes the second covering body 30B (covering body 30) formed on the second insulator 12. The second covering body 30B has the first layer 31 that is in contact with the second insulator 12. The first layer 31 has electrical conductivity. As such, heat generated from the resistive body 20 during the use of the resistor A20 flows through both the first insulator 11 and the second insulator 12. The heat that has flowed through the second insulator 12 flows through the second covering body 30B. Since the second covering body 30B has the first layer 31, the second covering body 30B has a higher electrical conductivity than each of the first insulator 11 and the second insulator 12. As a result, heat generated from the resistive body 20 easily flows through the second covering body 30B. The heat that has flowed through the second covering body 30B is released to the outside of the resistor A20. Accordingly, the resistor A20 can also improve heat dissipation property.

The second insulator 12 contains the fillers 122 that are electrically insulative. The fillers 122 can further improve the mechanical strength of the second insulator 12. Also, the fillers 122 are made of a material containing ceramics having a relatively high thermal conductivity. This further increases the thermal conductivity of the second insulator 12. Accordingly, heat generated from the resistive body 20 can be transferred in a larger amount to the second covering body 30B via the second insulator 12, and this further improves the heat dissipation property of the resistor A20.

The bottom portions 41 of the pair of electrodes 40 are in contact with the second layer 32 of the second covering body 30B. As a result, heat generated from the resistive body 20 and transferred to the second covering body 30B via the second insulator 12 can be quickly dissipated to the outside of the resistor A20 by means of the pair of electrodes 40.

Third Embodiment

Figure 24:
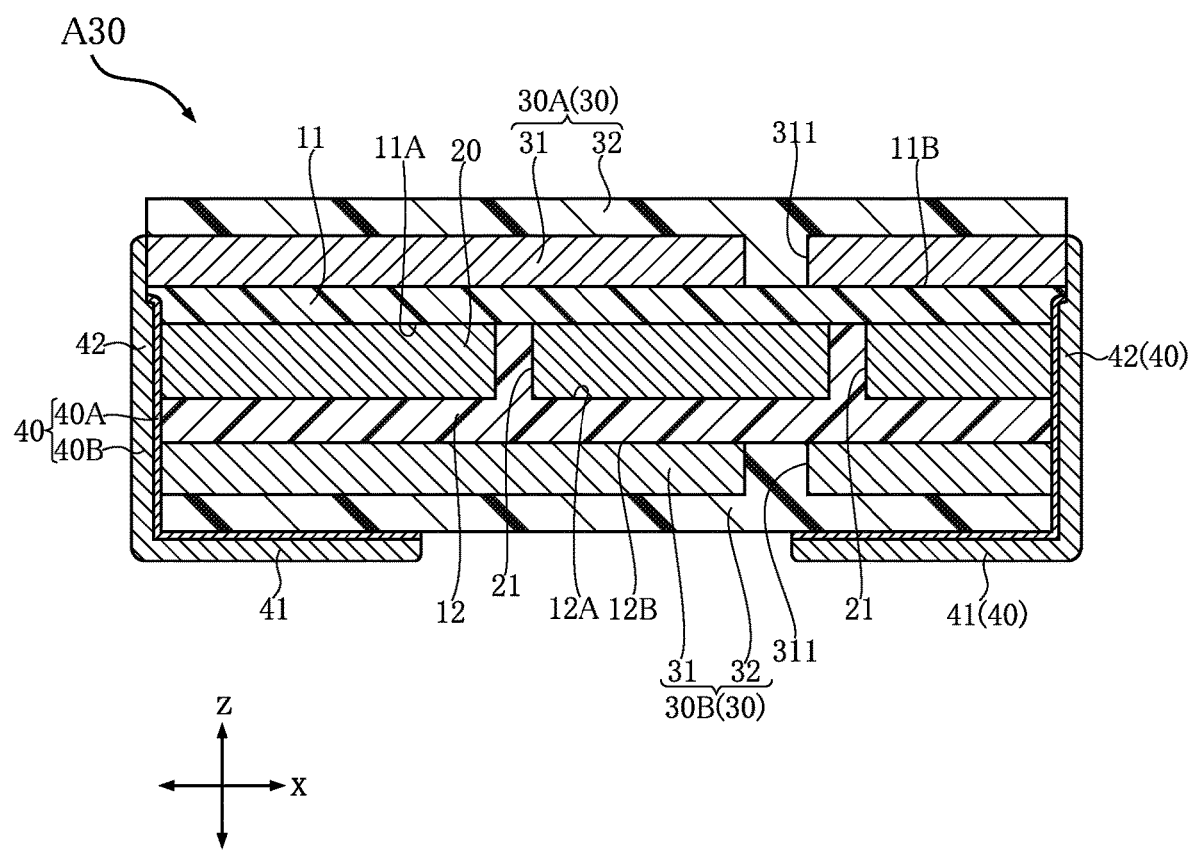
FIG. 24 is a cross-sectional view of a resistor according to a third embodiment of the present disclosure.
Figure 25:
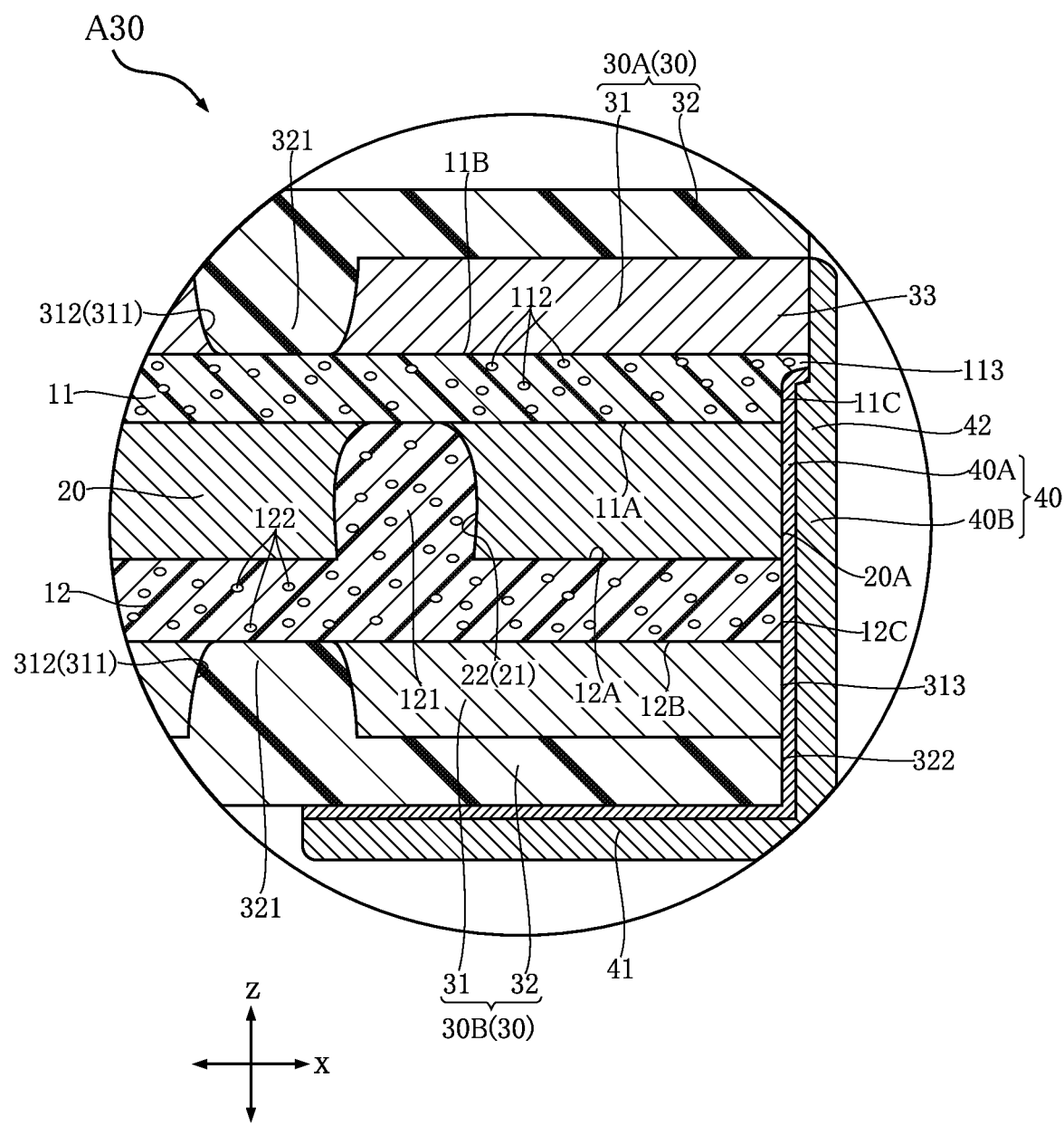
FIG. 25 is a partially enlarged view of FIG. 24.

With reference to FIGS. 24 to 25, a resistor A30 according to a third embodiment of the present disclosure will be described. In these figures, elements that are the same as or similar to the elements of the resistor A10 described above are provided with the same reference signs, and descriptions thereof are omitted. Note that the cross-sectional position shown in FIG. 24 is the same as the cross-sectional position shown in FIG. 6.

The resistor A30 is different from the resistor A10 described above in the structures of the second insulator 12, the covering body 30, and the pair of electrodes 40.

As shown in FIG. 25, the second insulator 12 contains fillers 122 that are electrically insulative. The fillers 122 are made of the same material as the fillers 112 contained in the first insulator 11 of the resistor A10 described above.

As shown in FIG. 24, the covering body 30 is formed on each of the first reverse surface 11B of the first insulator 11 and the second reverse surface 12B of the second insulator 12. As such, the resistor A30 includes both the first covering body 30A and the second covering body 30B of the covering body 30. The first covering body 30A of the resistor A30 has the same structure as the first covering body 30A of the resistor A10, and the second covering body 30B of the resistor A30 has the same structure as the second covering body 30B of the resistor A20. Thus, descriptions of the first covering body 30A and the second covering body 30B are omitted.

As shown in FIGS. 24 and 25, the bottom portions 41 of the pair of electrodes 40 are in contact with the second layer 32 of the second covering body 30B. As shown in FIG. 25, the side portions 42 of the pair of electrodes 40 are in contact with the pair of first end surfaces 20A of the resistive body 20, the pair of second end surfaces 12C of the second insulator 12, and the pair of third end surfaces 11C of the first insulator 11. Furthermore, the pair of side portions 42 are in contact with the pair of fourth end surfaces 313 of the first layer 31 and the pair of fifth end surfaces 322 of the second layer 32. The pair of side portions 42 are in contact with both the pair of first protrusions 33 of the first covering body 30A and the pair of second protrusions 113 of the first insulator 11. The resistor A30 can also have the same structure as each of the resistor A11 (see FIG. 17) and the resistor A12 (see FIG. 18).

The following describes advantages of the resistor A30.

The resistor A30 includes the first covering body 30A (covering body 30) formed on the first insulator 11, and the second covering body 30B (covering body 30) formed on the second insulator 12. The first covering body 30A has the first layer 31 that is in contact with the first insulator 11. The second covering body 30B has the first layer 31 that is in contact with the second insulator 12. The first layer 31 has electrical conductivity. As such, heat generated from the resistive body 20 during the use of the resistor A30 flows through both the first insulator 11 and the second insulator 12 to the first covering body 30A and the second covering body 30B. Since the first covering body 30A and the second covering body 30B have the respective first layers 31, the first covering body 30A and the second covering body 30B have higher conductivities than the first insulator 11 and the second insulator 12. As a result, heat generated from the resistive body 20 easily flows through the first covering body 30A and the second covering body 30B. The heat that has flowed through the first covering body 30A and the second covering body 30B is released to the outside of the resistor A30. Accordingly, the resistor A30 can also improve heat dissipation property.

Fourth Embodiment

Figure 26:
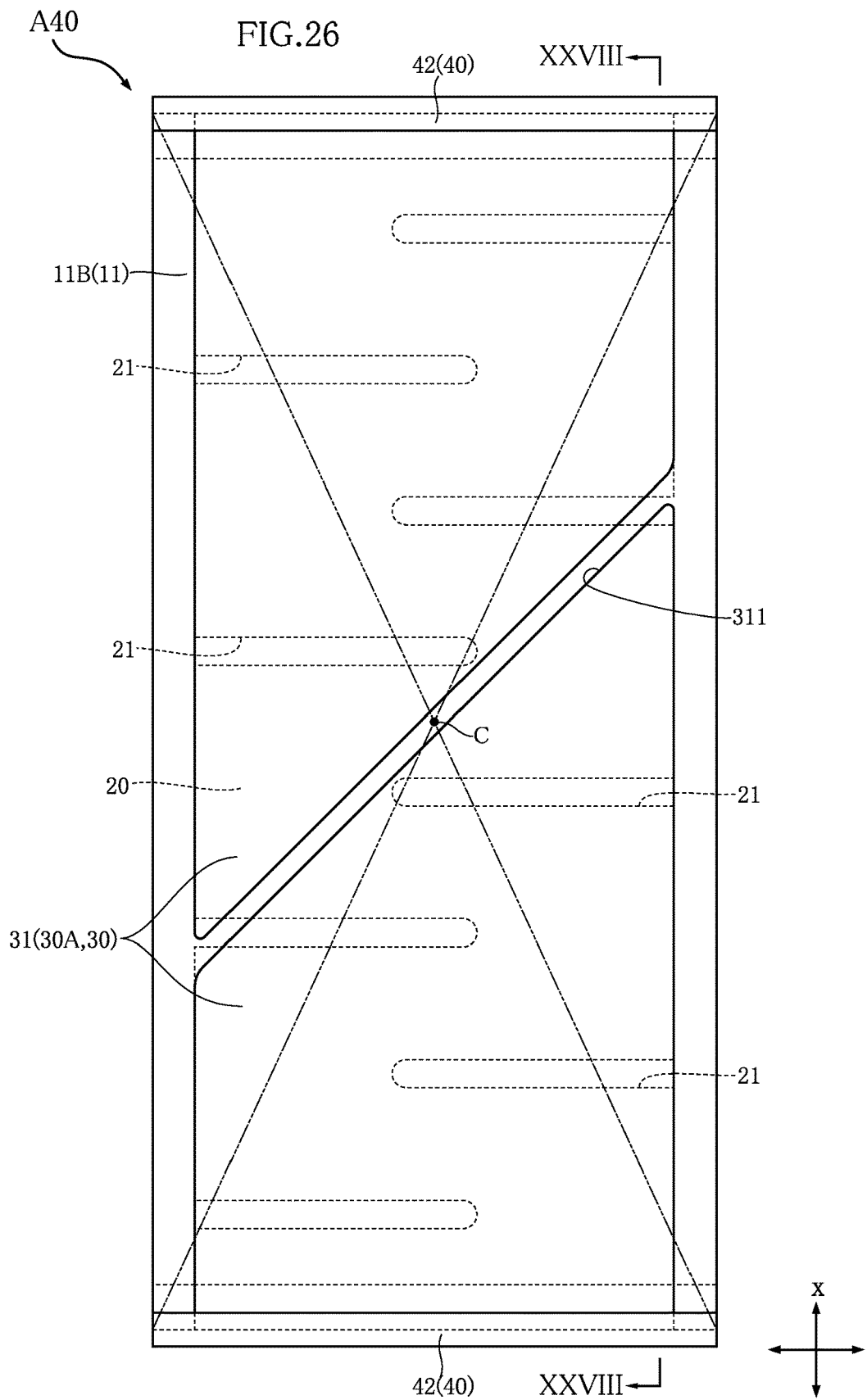
FIG. 26 is a plan view of a resistor according to a fourth embodiment of the present disclosure, and seen through a second layer of a covering body.

With reference to FIGS. 26 to 29, a resistor A40 according to a fourth embodiment of the present disclosure will be described. In these figures, elements that are the same as or similar to the elements of the resistor A10 described above are provided with the same reference signs, and descriptions thereof are omitted. For convenience of understanding, FIG. 26 is shown through the second layer 32 of the covering body 30.

The resistor A40 is different from the resistor A10 described above in the dimensions of the components and the structures of the pair of electrodes 40.

Figure 27:
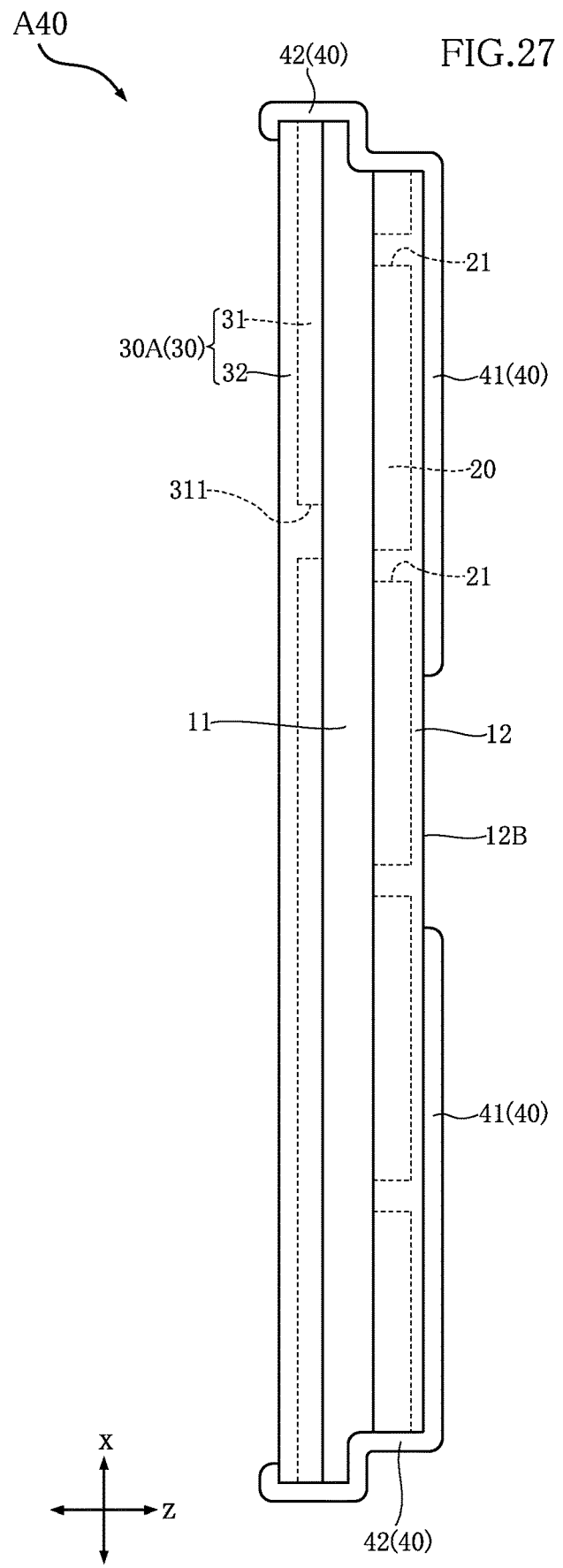
FIG. 27 is a front view of the resistor shown in FIG. 26.
Figure 28:
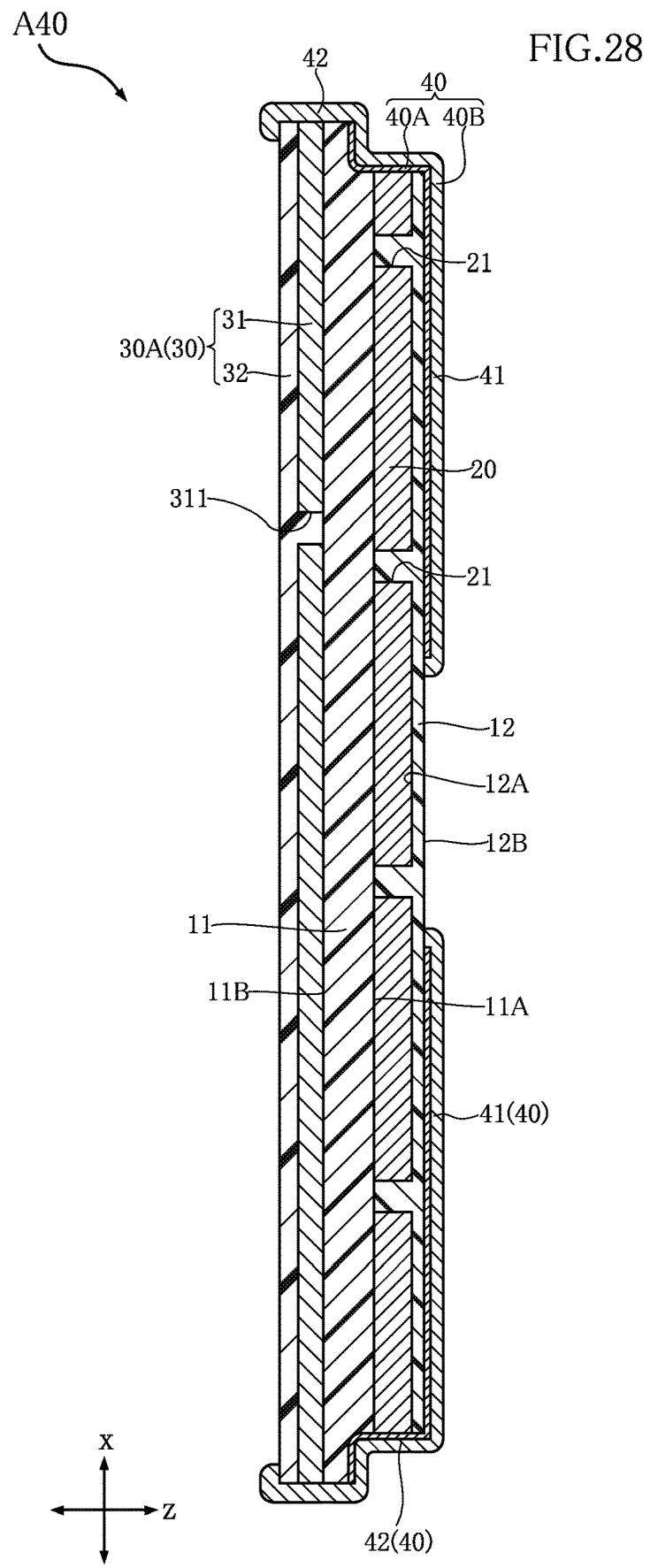
FIG. 28 is a cross-sectional view along line XXVIII-XXVIII in FIG. 26.

The first insulator 11, the resistive body 20, the second insulator 12, the covering body 30, and the pair of electrodes 40 that constitute the resistor A40 have the same dimensions as the corresponding components of the resistor A10 in the first direction x and the second direction y. However, as can be seen in FIGS. 26 to 28, these components of the resistor A40 have smaller dimensions than the corresponding components of the resistor A10 in the thickness direction z. The resistor A40 is closer to the actual product in dimensions than the resistor A10. Furthermore, the number of resistive slits 21 of the resistive body 20 is larger than the number of resistive slits 21 of the resistor A10.

Figure 29:
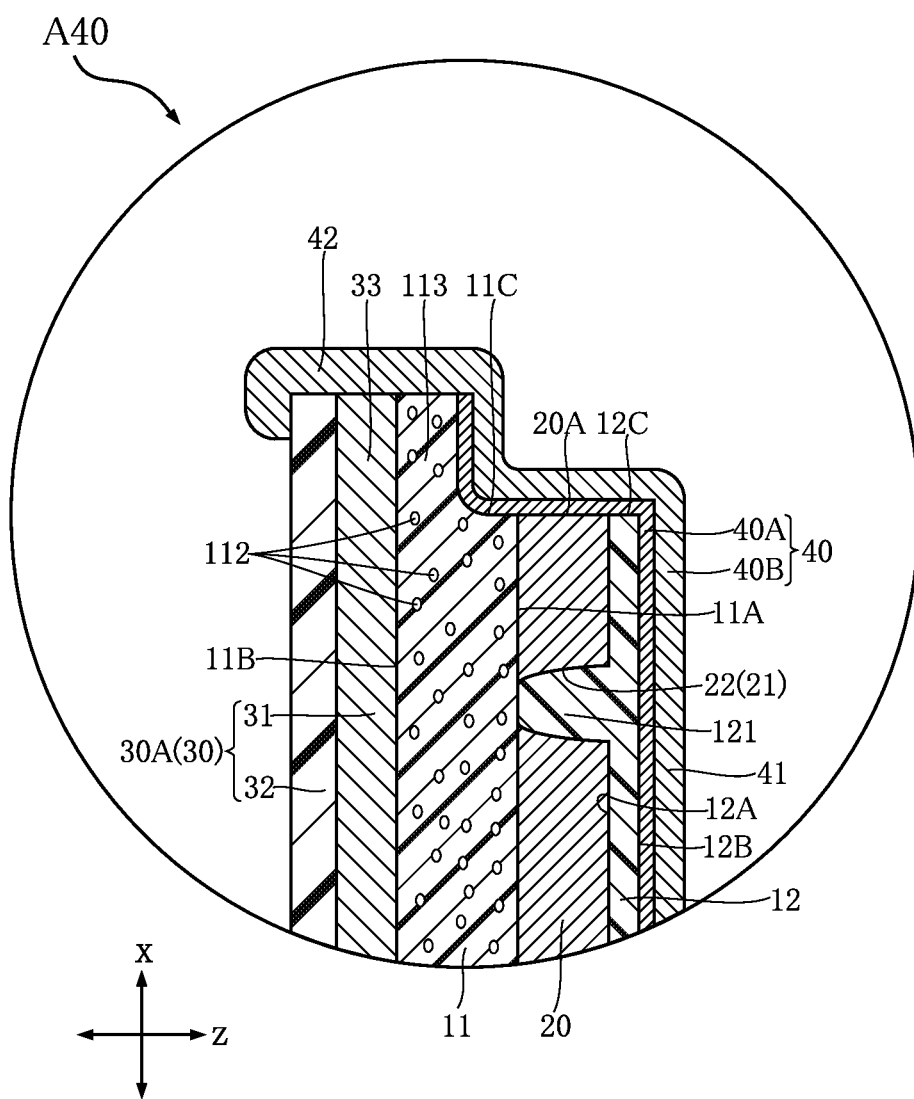
FIG. 29 is a partially enlarged view of FIG. 28.

As shown in FIGS. 28 and 29, the side portions 42 of the pair of electrodes 40 are in contact with the second layer 32 of the first covering body 30A (covering body 30). As shown in FIG. 29, the pair of first protrusions 33 of the first covering body 30A have larger dimensions than the corresponding protrusions in the resistor A10 in the first direction x. Furthermore, the pair of second protrusions 113 of the first insulator 11 have larger dimensions than the corresponding protrusions in the resistor A10 in the first direction x.

The present disclosure is not limited to the foregoing embodiments. Various design changes can be made to the specific structures of the elements of the present disclosure.

Various embodiments of the present disclosure can be defined as the following clauses.

Clause 1. A resistor comprising:
a first insulator including an obverse surface facing in a thickness direction;
a resistive body provided on the obverse surface;
a second insulator covering the resistive body;
a pair of electrodes electrically connected to the resistive body at both sides in a first direction perpendicular to the thickness direction; and
a covering body formed on at least one of the first insulator and the second insulator,
wherein the covering body includes an electroconductive first layer held in contact with at least one of the first insulator and the second insulator.

Clause 2. The resistor according to clause 1, wherein the first layer is provided with a slit extending through in the thickness direction, and
the first layer is divided into a plurality of areas by the slit.

Clause 3. The resistor according to clause 2, wherein the slit is inclined relative to the first direction, as viewed along the thickness direction.

Clause 4. The resistor according to clause 2, wherein as viewed along the thickness direction, the slit includes: a first slit extending in the first direction; and a plurality of second slits extending in a second direction perpendicular to the thickness direction and the first direction.

Clause 5. The resistor according to any of clauses 2 to 4, wherein the first layer is made of a material that contains copper.

Clause 6. The resistor according to any of clauses 2 to 5, wherein at least one of the first insulator and the second insulator contains fillers that are electrically insulative, and
the fillers are made of a material containing ceramics.

Clause 7. The resistor according to any of clauses 2 to 6, wherein the covering body includes a second layer that is formed on the first layer and electrically insulative, and
a part of the second layer is disposed in the slit.

Clause 8. The resistor according to clause 7, wherein side walls of the slit are recessed toward an inside of the first layer.

Clause 9. The resistor according to clause 7 or 8, wherein the resistive body is provided with a resistive slit that extends through in the thickness direction, and
at least one of the first insulator and the second insulator is disposed in the resistive slit.

Clause 10. The resistor according to clause 9, wherein side walls of the resistive slit are recessed toward an inside of the resistive body.

Clause 11. The resistor according to any of clauses 7 to 10, wherein each of the pair of electrodes includes a bottom portion and a side portion, the bottom portion is opposite from the resistive body with respect to the second insulator in the thickness direction, and overlaps with the obverse surface as viewed along the thickness direction, the side portion is connected to the bottom portion of a corresponding one of the pair of electrodes, and extends in the thickness direction, the resistive body includes a pair of first end surfaces facing in the first direction, and the side portion of each of the pair of electrodes is in contact with one of the pair of first end surfaces.

Clause 12. The resistor according to clause 11, wherein the second insulator includes a pair of second end surfaces, each of the pair of second end surfaces facing in the first direction and being flush with one of the pair of first end surfaces, and
the side portion of each of the pair of electrodes is in contact with one of the pair of second end surfaces.

Clause 13. The resistor according to clause 12, wherein the first insulator includes a pair of third end surfaces, each of the pair of third end surfaces facing in the first direction and being flush with one of the pair of first end surfaces, and
the side portion of each of the pair of electrodes is in contact with one of the pair of third end surfaces.

Clause 14. The resistor according to any of clauses 11 to 13, wherein the covering body includes a first covering body formed on the first insulator,
the first covering body includes a pair of first protrusions separated from each other in the first direction and protruding from the pair of first end surfaces in the first direction, and
the side portion of each of the pair of electrodes is in contact with one of the pair of first protrusions.

Clause 15. The resistor according to clause 14, wherein the pair of first protrusions are formed of the second layer of the first covering body.

Clause 16. The resistor according to clause 14, wherein the first insulator includes a pair of second protrusions separated from each other in the first direction and protruding from the pair of first end surfaces in the first direction, and
the side portion of each of the pair of electrodes is in contact with both one of the pair of first protrusions and one of the pair of second protrusions.

Clause 17. The resistor according to any of clauses 14 to 16, wherein the covering body further includes a second covering body formed on the second insulator, and
the bottom portions of the pair of electrodes are in contact with the second layer of the second covering body.

The invention claimed is:
1. A resistor comprising:
a first insulator including an obverse surface facing in a thickness direction;
a resistive body provided on the obverse surface;
a second insulator covering the resistive body;
a pair of electrodes electrically connected to the resistive body at both sides in a first direction perpendicular to the thickness direction; and
a covering body formed on at least one of the first insulator and the second insulator,
wherein the covering body includes an electroconductive first layer held in contact with at least one of the first insulator and the second insulator,
wherein each of the pair of electrodes includes a bottom portion and a side portion,
the bottom portion is opposite from the resistive body with respect to the second insulator in the thickness direction, and overlaps with the obverse surface as viewed along the thickness direction, the side portion is connected to the bottom portion of a corresponding one of the pair of electrodes, and extends in the thickness direction, the resistive body includes a pair of first end surfaces facing in the first direction, and the side portion of each of the pair of electrodes is in contact with one of the pair of first end surfaces, and wherein the second insulator includes a pair of second end surfaces, each of the pair of second end surfaces facing in the first direction and being flush with one of the pair of first end surfaces, and the side portion of each of the pair of electrodes is in contact with one of the pair of second end surfaces.

2. The resistor according to claim 1, wherein the first layer is provided with a slit extending through in the thickness direction, and the first layer is divided into a plurality of areas by the slit.

3. The resistor according to claim 2, wherein the slit is inclined relative to the first direction as viewed along the thickness direction.

4. The resistor according to claim 3, wherein the first layer is made of a material that contains copper.

5. The resistor according to claim 3, wherein at least one of the first insulator and the second insulator contains fillers that are electrically insulative, and the fillers are made of a material containing ceramics.

6. The resistor according to claim 2, wherein as viewed along the thickness direction, the slit includes: a first slit extending in the first direction; and a plurality of second slits extending in a second direction perpendicular to the thickness direction and the first direction.

7. The resistor according to claim 6, wherein the first layer is made of a material that contains copper.

8. The resistor according to claim 2, wherein the first layer is made of a material that contains copper.

9. The resistor according to claim 2, wherein at least one of the first insulator and the second insulator contains fillers that are electrically insulative, and the fillers are made of a material containing ceramics.

10. The resistor according to claim 2, wherein the covering body includes a second layer that is formed on the first layer and electrically insulative, and a part of the second layer is disposed in the slit.

11. The resistor according to claim 10, wherein side walls of the slit are recessed toward an inside of the first layer.

12. The resistor according to claim 10, wherein the resistive body is provided with a resistive slit that extends through in the thickness direction, and at least one of the first insulator and the second insulator is disposed in the resistive slit.

13. The resistor according to claim 12, wherein side walls of the resistive slit are recessed toward an inside of the resistive body.

14. The resistor according to claim 1, wherein the first insulator includes a pair of third end surfaces, each of the pair of third end surfaces facing in the first direction and being flush with one of the pair of first end surfaces, and the side portion of each of the pair of electrodes is in contact with one of the pair of third end surfaces.

15. A resistor comprising:

a first insulator including an obverse surface facing in a thickness direction;

a resistive body provided on the obverse surface;

a second insulator covering the resistive body;

a pair of electrodes electrically connected to the resistive body at both sides in a first direction perpendicular to the thickness direction; and a covering body formed on at least one of the first insulator and the second insulator, wherein the covering body includes an electroconductive first layer held in contact with at least one of the first insulator and the second insulator, wherein each of the pair of electrodes includes a bottom portion and a side portion, the bottom portion is opposite from the resistive body with respect to the second insulator in the thickness direction, and overlaps with the obverse surface as viewed along the thickness direction, the side portion is connected to the bottom portion of a corresponding one of the pair of electrodes, and extends in the thickness direction, the resistive body includes a pair of first end surfaces facing in the first direction, and the side portion of each of the pair of electrodes is in contact with one of the pair of first end surfaces, and wherein the covering body includes a first covering body formed on the first insulator, the first covering body includes a pair of first protrusions separated from each other in the first direction and protruding from the pair of first end surfaces in the first direction, and the side portion of each of the pair of electrodes is in contact with one of the pair of first protrusions.

16. The resistor according to claim 15, wherein the pair of first protrusions are formed of the second layer of the first covering body.

17. The resistor according to claim 15, wherein the first insulator includes a pair of second protrusions separated from each other in the first direction and protruding from the pair of first end surfaces in the first direction, and the side portion of each of the pair of electrodes is in contact with both one of the pair of first protrusions and one of the pair of second protrusions.

18. The resistor according to claim 15, wherein the covering body further includes a second covering body formed on the second insulator, and the bottom portions of the pair of electrodes are in contact with the second layer of the second covering body.

* * * * *